(12) United States Patent
Ahmed et al.

(10) Patent No.: US 9,806,127 B1
(45) Date of Patent: Oct. 31, 2017

(54) MICRO WALL LIGHT EMITTING DIODES

(71) Applicant: Intel Corporation, Santa Clara, CA (US)

(72) Inventors: Khaled Ahmed, Anaheim, CA (US); Ali Khakifirooz, Los Altos, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/381,943

(22) Filed: Dec. 16, 2016

(51) Int. Cl.
*H01L 33/00* (2010.01)
*H01L 27/15* (2006.01)
*H01L 33/46* (2010.01)
*H01L 33/32* (2010.01)
*H01L 33/06* (2010.01)
*H01L 33/42* (2010.01)

(52) U.S. Cl.
CPC ........ *H01L 27/156* (2013.01); *H01L 33/0075* (2013.01); *H01L 33/06* (2013.01); *H01L 33/32* (2013.01); *H01L 33/325* (2013.01); *H01L 33/42* (2013.01); *H01L 33/46* (2013.01); *H01L 2933/0016* (2013.01); *H01L 2933/0025* (2013.01); *H01L 2933/0058* (2013.01)

(58) Field of Classification Search
None
See application file for complete search history.

(56) References Cited

U.S. PATENT DOCUMENTS

2008/0122350 A1* 5/2008 Sakata ................ H01L 51/5203
313/504

* cited by examiner

*Primary Examiner* — Cheung Lee
(74) *Attorney, Agent, or Firm* — Green, Howard & Mughal LLP

(57) ABSTRACT

Embodiments related to light emitting diodes having an electron transport layer core with first and second opposite sidewalls extending from a proximal end of the electron transport layer core adjacent to the substrate to a distal end of the electron transport layer core extending away from the substrate, an emission layer disposed on both the first and second sidewalls, and a hole transport layer disposed on the emission layer, displays having such light emitting diodes, systems incorporating such light emitting diodes, and methods for fabricating them are discussed.

25 Claims, 26 Drawing Sheets

201

```
┌─────────────────────────────────────────────────┐
│ Dispose Electron Transport Layer Core within a  │
│ Trench of a Patterned Layer                     │
│ 202                                             │
└─────────────────────────────────────────────────┘
                      ↓
┌─────────────────────────────────────────────────┐
│ Remove at Least a Portion of the Patterned      │
│ Layer to Expose Portions of Sidewalls of the    │
│ Electron Transport Layer Core                   │
│ 203                                             │
└─────────────────────────────────────────────────┘
                      ↓
┌─────────────────────────────────────────────────┐
│ Dispose Active Emission Layer on the Exposed    │
│ Sidewalls                                       │
│ 204                                             │
└─────────────────────────────────────────────────┘
                      ↓
┌─────────────────────────────────────────────────┐
│ Dispose Hole Transport Layer on the Active      │
│ Admission Layer                                 │
│ 205                                             │
└─────────────────────────────────────────────────┘
                      ↓
┌─────────────────────────────────────────────────┐
│ Dispose and Pattern Reflective Metallic         │
│ Cladding over the Hole Transport Layer          │
│ 206                                             │
└─────────────────────────────────────────────────┘
                      ↓
┌─────────────────────────────────────────────────┐
│ Bond Reflective Metallic Cladding to a Contact  │
│ of a Driver Circuit                             │
│ 207                                             │
└─────────────────────────────────────────────────┘
                      ↓
┌─────────────────────────────────────────────────┐
│ Dispose Transparent Electrode over Surface      │
│ Opposite the Driver Circuit                     │
│ 208                                             │
└─────────────────────────────────────────────────┘
```

FIG. 2

MICRO WALL LIGHT EMITTING DIODES

BACKGROUND

Micro light emitting diode (LED) display technology for devices such as wearable devices (e.g., watches, augmented reality devices, virtual reality devices) or display devices of mobile or stationary devices is an emerging technology area. Such devices may require red-green-blue (RGB) colors (e.g., full color), high brightness (e.g., more than 2,000 cd/m$^2$), high contrast, low power, high pixel densities (e.g., more than 2,500 pixels per inch), and low manufacturing costs to provide high quality products for users.

As such, there is a continual demand for improved micro LED devices, systems, and fabrication techniques. It is with respect to these and other considerations that the present improvements have been needed. Such improvements may become critical as the desire to provide high quality displays in a variety of devices such as wearable devices becomes more widespread.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIG. 2 is a flow diagram illustrating an example process for fabricating a light emitting diode device;

DETAILED DESCRIPTION

Figure 1A:
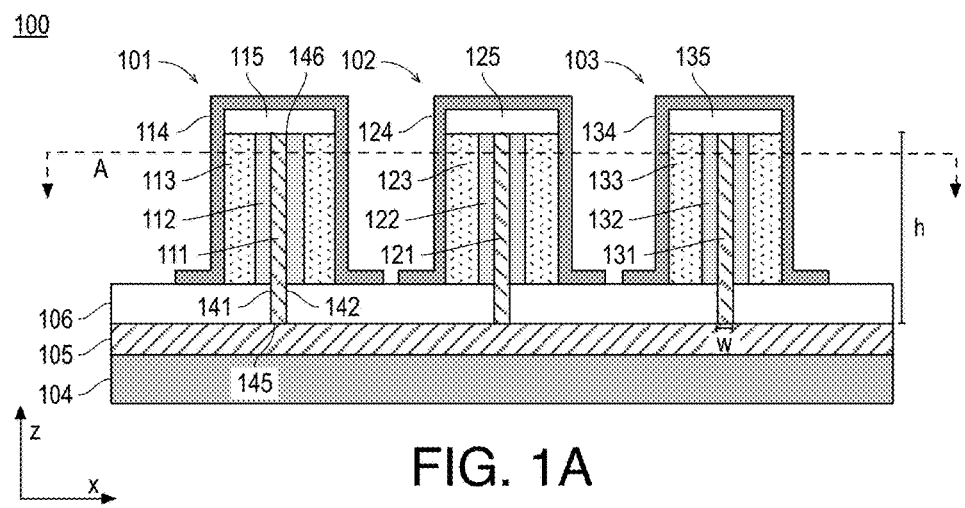
FIG. 1A is a cross-sectional view of an example light emitting diode structure including example micro light emitting diodes.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "in one embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not specified to be mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

Micro light emitting diodes, integrated circuits, devices, apparatuses, computing platforms, and methods are described below related micro wall light emitting diodes.

In some embodiments discussed herein, a light emitting diode device includes an electron transport layer core disposed over a substrate. The electron transport layer core includes a first sidewall and a second sidewall opposite the first sidewall such that the first sidewall and the second sidewall each extend from a proximal end of the electron transport layer core adjacent to the substrate to a distal end of the electron transport layer core extending away from the substrate. For example, the electron transport layer core may have a substantially rectangular cuboid shape or the shape of a wall. Adjacent to each of the first and second sidewalls, opposite third and fourth sidewalls of the electron transport layer core may also extend from the proximal end to the distal end of the electron transport layer core. The light emitting diode device may include an emission layer disposed on both the first and second sidewalls, a hole transport layer disposed on the emission layer, and a reflective cladding over the hole transport layer. For example, the emission layer may wrap around the electron transport layer core, the hole transport layer may wrap around the emission layer, and a reflective cladding may cover the other layers of the structure. Furthermore, electrodes may provide coupling to the light emitting diode device such that, in operation, the light emitting diode device may emit a band of light.

Such an alignment of the light emitting diode device, with the electron transport layer core extending substantially perpendicular with respect to a substrate surface and with an emission layer over sidewalls of the electron transport layer core and a hole transport layer disposed on the emission layer may provide advantages such as increased surface area contact between adjacent layers, increased operating efficiency, and a reduced footprint (as compared to LEDs having layers extending in a parallel manner with respect to the substrate).

As is discussed further herein, in some embodiments, second and third light emitting diode devices to emit different bands of light may also be provided such that a red-green-blue display device is provided. Such RGB micro LED devices may be assembled from red, green, and blue micro light emitting diodes manufactured separately (e.g., fabricated on separate carriers and subsequently assembled using pick and place techniques or the like) or such RGB micro LED devices may be manufactured on the same substrate or carrier or the like by selectively exposing electron transport layer cores for the growth of selective emission layers for the respective red, green, and blue micro light emitting diodes. Such micro LEDs on the same carrier may then be directly bonded to a driver circuit back plane or wafer or the like using direct bonding techniques.

In another embodiment, a system may include a processor, a display device having a light emitting diode devices as discussed herein, and other components such as a wireless transceiver or the like. Such a system may be provided in any suitable form factor device such as a watch, an augmented reality device, a virtual reality device, a headset, a mobile device such as a smartphone, a tablet, a laptop, a phablet (e.g., a 5 inch side display), or the like or as a discrete display device or the like.

Figure 1B:
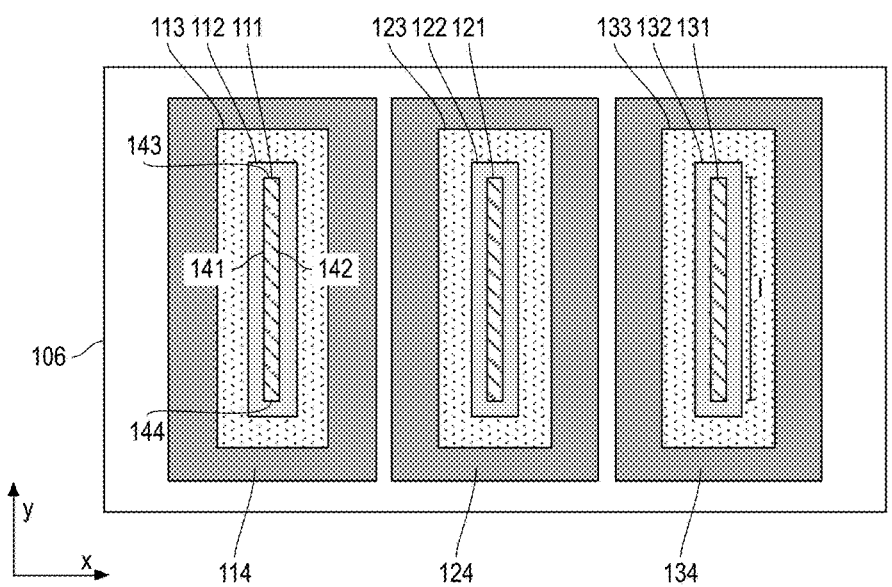
FIG. 1B is a plan view of the example light emitting diode structure of FIG. 1A.

FIG. 1A is a cross-sectional view of an example light emitting diode structure 100 including example micro light emitting diodes 101, 102, 103 and FIG. 1B is a plan view of the example light emitting diode structure of FIG. 1A, arranged in accordance with at least some implementations of the present disclosure. FIG. 1B provides a cross-sectional view taken along plane A as shown in the plan view of FIG. 1A. In some examples, light emitting diode structure 100 may be characterized as a micro light emitting diode device or the like. As shown, micro light emitting diode 101 may include an electron transport layer core 111, an active emission layer 112, a hole transport layer 113, an end cap layer 115, and a reflective cladding 114. Micro light emitting diode 102 may include an electron transport layer core 121, an active emission layer 122, a hole transport layer 123, an end cap layer 125, and a reflective cladding 124. Similarly, micro light emitting diode 103 may include an electron transport layer core 131, an active emission layer 132, a hole transport layer 133, an end cap layer 135, and a reflective cladding 134. Also as shown, micro light emitting diodes 101, 102, 103 may be disposed on or over a carrier 104, a buffer layer 105, and a dielectric layer 106.

Light emitting diode structure 100 may include any number of micro light emitting diodes such as micro light emitting diodes 101, 102, 103. In an embodiment, micro light emitting diodes 101, 102, 103 may each be fabricated or configured to emit the same band of light (e.g., a red, green, or blue band). In an embodiment, each of micro light emitting diodes 101, 102, 103 may be fabricated or configured to emit the different bands of light. For example, in operation, micro light emitting diode 101 may emit a red band, micro light emitting diode 102 may emit a green band, and micro light emitting diode 103 may emit a blue band. As is discussed further herein, such RGB micro light emitting diodes may be arrayed to provide a display device. In an embodiment, the different bands of light may be effectuated by adjusting an indium concentration in the indium gallium nitride layer(s) in each of active emission layer 112, active emission layer 122, and active emission layer 132. In an embodiment, an indium concentration of about 41% in the indium gallium nitride layer(s) may provide a red color micro LED, an indium concentration of about 37% in the indium gallium nitride layer(s) may provide a green color micro LED, and an indium concentration of about 20% in the indium gallium nitride layer(s) may provide a blue color micro LED.

Electron transport layer cores 111, 121, 131 may include any suitable material or materials. In an embodiment, electron transport layer cores 111, 121, 131 include n-doped gallium nitride (N—GaN). Electron transport layer cores 111, 121, 131 may be characterized as a core, an electron transport layer, or the like. Active emission layers 112, 122, 132 may also include any suitable material or materials. In an embodiment, active emission layers 112, 122, 132 include one or more layers of indium gallium nitride (InGaN) and one or more layers of gallium nitride (GaN). Active emission layers 112, 122, 132 may be characterized as multiple quantum wells (MQW), active layers, emission layers, or the like. As discussed, the indium concentration in the indium gallium nitride layer(s) of active emission layers 112, 122, 132 may be tuned to define the band of light emitted. Hole transport layers 113, 123, 133 may similarly include any suitable material or materials. In an embodiment, hole transport layers 113, 123, 133 include p-doped gallium nitride (P—GaN). Hole transport layers 113, 123, 133 may be characterized as a hole layer, a p-cladding, or the like.

In operation, coupling may be made to micro light emitting diodes 101, 102, 103 via reflective claddings 114, 124, 134 (e.g., by each of claddings 114, 124, 134 being electrically coupled to an electrode of a driver circuit), which, as shown, may be electrically isolated from one another, and a common electrode (e.g., after removal of carrier 104 and the fabrication of the electrode). Such couplings are discussed further herein with respect to FIG. 3M and elsewhere herein. Micro light emitting diodes 101, 102, 103 may then each be activated to generate a band of light. In the context of FIG. 1A, light may emit from the bottom (e.g., after removal of carrier 104) micro light emitting diodes 101, 102, 103. The arrangement of micro light emitting diodes 101, 102, 103 may provide for efficient generation and emission of light as well as highly collimated light.

As discussed, micro light emitting diodes 101, 102, 103 may be disposed on or over carrier 104, buffer layer 105, and dielectric layer 106. Carrier 104 may be any suitable material or materials such as silicon (Si), silicon carbide (SiC), sapphire, or the like. For example, carrier 104 may be a carrier wafer. Buffer layer 105 may also be any suitable material or materials. For example, buffer layer 105 may provide a transition from carrier 104 for the fabrication of electron transport layer cores 111, 121, 131. For example, buffer layer 105 may include a stack of layers including one or more of aluminum nitride, silicon nitride, gallium nitride, aluminum gallium nitride, or the like. In some examples, buffer layer 105 may be characterized as a nucleation layer. Dielectric layer 106 may include any suitable material or materials that provides electrical isolation between micro light emitting diodes 101, 102, 103. For example, dielectric layer 106 may include silicon nitride or the like. In the context of FIG. 1A, dielectric layer 106 may include a single material. In other examples, dielectric layer 106 may include multiple regions of differing materials as is discussed further herein. As used herein, the term substrate may indicate any layer or layers adjacent to micro light emitting diodes 101, 102, 103. For example, one or more of carrier 104, buffer layer 105, and dielectric layer 106 may provide a substrate for micro light emitting diodes 101, 102, 103. Furthermore a substrate may be monolithic in that it includes a continuous layer or layers, material or materials, structure, group of structures, or the like.

As discussed, micro light emitting diodes 101, 102, 103 may include electron transport layer cores 111, 121, 131, respectively. As shown with respect to electron transport layer core 111, electron transport layer cores 111, 121, 131 may include sidewalls 141, 142, 143, 144 such that sidewall 141 is opposite sidewall 142 and sidewall 143 is opposite sidewall 144. Also as shown, sidewalls 141, 142, 143, 144 may extend from a proximal end 145 adjacent to buffer layer 105 and carrier 104 to a distal end 146 extending away from buffer layer 105 and carrier 104. For example, sidewalls 141, 143 may be substantially parallel and/or sidewalls 143, 144 may be substantially parallel. In an embodiment, electron transport layer core 111 may have a substantially rectangular cuboid shape.

Furthermore, as shown with respect to electron transport layer core 131, electron transport layer cores 111, 121, 131 may have a width (w) of about 1 micron, a height (h) of about 1 to 3 microns, and a length (l) of about 1 to 10 microns, with 5 microns being particularly advantageous. However, electron transport layer cores 111, 121, 131 may have any suitable dimensions. For example, the width (w) may be in the range of about 500 nm to 2 microns, the height (h) may be in the range of about of about 1 to 3 microns, and the length (l) may be in the range of about of about 1 to 10 microns. Electron transport layer cores 111, 121, 131 therefore have a substantial wall shape extending from buffer layer 105 (e.g., a substrate).

As shown, active emission layers 112, 122, 132 may be disposed on sidewalls of electron transport layer cores 111, 121, 131 as illustrate with respect to sidewalls 141, 142, 143, 144 of electron transport layer core 111. For example, active emission layers 112, 122, 132 may wrap around portions of the sidewalls of electron transport layer cores 111, 121, 131. Similarly, hole transport layers 113, 123, 133 may be disposed on sidewalls of active emission layers 112, 122, 132. For example, hole transport layers 113, 123, 133 may wrap around portions of active emission layers 112, 122, 132. The discussed shape of electron transport layer cores 111, 121, 131 (e.g., a wall shape or a rectangular cuboid shape or the like) may provide for substantial contact area among electron transport layer cores 111, 121, 131, active emission layers 112, 122, 132, and hole transport layers 113, 123, 133 for improved efficiency. Furthermore, electron transport layer cores 111, 121, 131 extending substantially along a vertical axis or perpendicular to buffer layer 105 and carrier 104 may provide for an efficient emission route for light generated by micro light emitting diodes 101, 102, 103. For example, the vertical alignment along with reflective claddings 114, 124, 134 may provide a direct (downward in FIG. 1A) route for the escape and emission of light. Furthermore the vertical alignment and reflective claddings 114, 124, 134 may provide substantially collimated light from micro light emitting diodes 101, 102, 103. Furthermore the discussed vertical alignment may provide a relatively small footprint for micro light emitting diodes 101, 102, 103 (e.g., as shown with respect to FIG. 1B).

With continued reference to FIGS. 1A and 1B, as shown, micro light emitting diodes 101, 102, 103 may include end caps 114, 124, 134. End caps 114, 124, 134 may include any suitable material or materials such as silicon dioxide, aluminum nitride, or the like. In an embodiment, end caps 114, 124, 134 may provide end cap layers on distal ends of electron transport layer cores 111, 121, 131 as illustrated with respect to distal end 146. Furthermore, as shown, end caps 114, 124, 134 may also cover distal ends of active emission layers 112, 122, 132 and hole transport layers 113, 123, 133. For example, during fabrication of micro light emitting diodes 101, 102, 103, end caps 114, 124, 134 may eliminate or reduce growth of active emission layers 112, 122, 132 and hole transport layers 113, 123, 133 on distal ends of electron transport layer cores 111, 121, 131, Also as shown, micro light emitting diodes 101, 102, 103 may include reflective claddings 114, 124, 134, which may include any suitable material or materials such as one or more metals or the like. For example, reflective claddings 114, 124, 134 may provide reflection of light generated by micro light emitting diodes 101, 102, 103 and electrical contact (e.g., an electrode) to hole transport layers 113, 123, 133 of micro light emitting diodes 101, 102, 103.

FIG. 2 is a flow diagram illustrating an example process 201 for fabricating a light emitting diode device, arranged in accordance with at least some implementations of the present disclosure. For example, process 201 may be implemented to fabricate any suitable light emitting diode structure discussed herein such as light emitting diode structure 100. In the illustrated implementation, process 201 may include one or more operations as illustrated by operations 202-207. However, embodiments herein may include additional operations, certain operations being omitted, or operations being performed out of the order provided.

Process 201 may begin at operation 202, where an electron transport layer core may be disposed within a trench of a patterned layer over a substrate. The patterned layer may include any suitable material or materials such as silicon nitride and may be patterned using any suitable technique or techniques photolithography and etch techniques. The electron transport layer core may be disposed within the trench using any suitable technique or techniques such as metalorganic chemical vapor deposition, metal-organic vapor phase epitaxy, or the like. Furthermore, the substrate may include any suitable materials or layers such as a buffer layer or the like. The electron transport layer core may have any characteristics as discussed with respect to electron transport layer cores 111, 121, 131. For example, the electron transport layer may have first and second sidewalls extending from a proximal end of the electron transport layer core adjacent to the substrate to a distal end of the electron transport layer core extending away from the substrate. In an embodiment, one or more of electron transport layer cores 111, 121, 131 may be disposed within trenches of a patterned layer as discussed herein with respect to FIGS. 3A and 3B.

Process 201 may continue at operation 203, where at least a portion of the patterned layer may be removed to expose portions of sidewalls of the electron transport layer core. The portion of the patterned layer may be removed using any suitable technique or techniques such as wet etch techniques or the like. In an embodiment, an end cap layer may be patterned over the electron transport layer core and the patterned layer may be removed by selective wet etching (e.g., with an etch selectively of the patterned layer with respect to the end cap layer). In an embodiment, portions of the patterned layer may be removed to expose one or more of electron transport layer cores 111, 121, 131 as discussed herein with respect to FIGS. 3C-3E.

Process 201 may continue at operation 204, where an active emission layer may be disposed on the exposed sidewalls of the electron transport layer core. The active emission layer may be disposed on the exposed sidewalls of the electron transport layer core using any suitable technique or techniques such as selective epitaxy or the like. In an embodiment, active emission layers 112, 122, 132 may be disposed on the exposed portions of sidewalls of electron transport layer cores 111, 121, 131 as discussed herein with respect to FIG. 3F.

Process 201 may continue at operation 205, where a hole transport layer may be disposed on the active emission layer. The hole transport layer may be disposed on the exposed sidewalls of the electron transport layer core using any suitable technique or techniques such as selective epitaxy or the like. In an embodiment, hole transport layers 113, 123, 133 may be disposed on active emission layers 112, 122, 132 as discussed herein with respect to FIG. 3G.

Process 201 may continue at operation 206, where reflective cladding such as a reflective metal cladding may be disposed over the hole transport layer and patterned. The reflective cladding may be disposed and patterned using any suitable technique or techniques. For example, the reflective cladding may be disposed using electroplating or physical vapor deposition techniques and patterned by applying a planar surface, patterning the planar surface, and etching cladding exposed by the patterned planar surface. In an embodiment, reflective claddings 114, 124, 134 may be disposed on end caps 114, 124, 134 and hole transport layers 113, 123, 133 and patterned as discussed herein with respect to FIGS. 3H-3J.

Process 201 may continue at operation 207, where the reflective cladding may be bonded to a contact or conductive electrode or the like of a driver circuit. The reflective cladding may be bonded to the conductive electrode using any suitable technique or techniques. For example, the micro light emitting diode may be picked and placed on the conductive electrode (e.g., such that the reflective cladding is disposed on the conductive electrode) using direct transfer or stamp transfer operations, the carrier including the micro light emitting diode may be bonded to a substrate including the conductive electrode, or the like. Although discussed with respect to bonding techniques, in other examples, the driver circuit may be formed by monolithic integration of a thin film transistor (e.g., polysilicon, amorphous silicon, organic TFTs, etc.) or the like. In an embodiment, reflective claddings 114, 124, 134 may be disposed on contacts or conductive electrodes of a driver circuit as discussed herein with respect to FIG. 3K.

Process 201 may continue at operation 208, where a transparent electrode may be disposed over a surface of the micro light emitting diode or of an emission surface opposite the driver circuit. The transparent electrode may be disposed using any suitable technique or techniques. For example, the transparent electrode may be deposited using physical vapor deposition and patterned, if needed, using lithography and etch techniques. In an embodiment, the transparent electrode may be disposed on buffer layer 105 subsequent to the removal of carrier 104 as discussed herein with respect to FIGS. 3L and 3M.

Process 201 may be utilized to generate any light emitting diode structure as discussed herein such as those discussed with respect to light emitting diode structure 100. In an embodiment, process 201 may generate an example structure of micro light emitting diodes as shown with respect to FIG. 3M. In some embodiments, process 201 may generate multiple micro light emitting diodes configured to emit a same band of light (e.g., red, green, or blue LEDs).

Figure 3A:
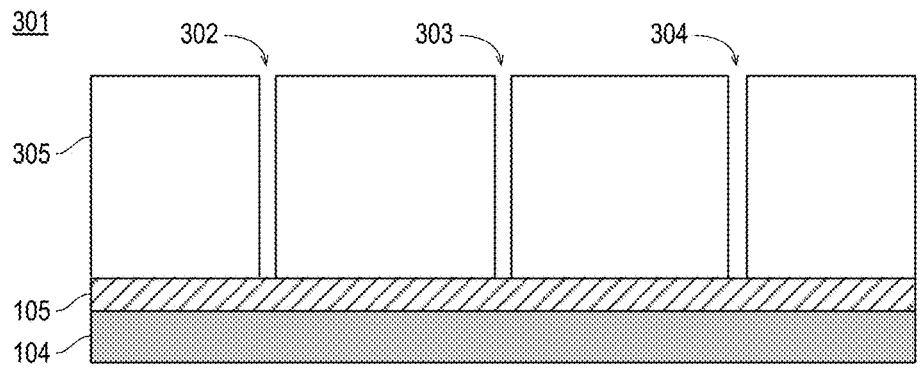
FIGS. 3A, 3B, 3C, 3D, 3E, 3F, 3G, 3H, 3I, 3J, 3K, 3L, and 3M are cross-sectional views of example light emitting diode structure s as particular fabrication operations are performed.

FIGS. 3A, 3B, 3C, 3D, 3E, 3F, 3G, 3H, 3I, 3J, 3K, 3L, and 3M are cross-sectional views of example light emitting diode structure s as particular fabrication operations are performed, arranged in accordance with at least some implementations of the present disclosure. FIG. 3A illustrates a cross-sectional view of a light emitting diode structure 301 taken along the same plan as shown in FIG. 1A. As shown in FIG. 3A, light emitting diode structure 301 includes carrier 104, buffer layer 105, and a patterned layer 305 having openings 302, 303, 304. For example, carrier 104 may be any carrier or substrate as discussed herein such as a silicon substrate or wafer, a silicon carbide substrate or wafer, a sapphire substrate or wafer, or the like. Buffer layer 105 may be formed on carrier 104 using any suitable technique or techniques. For example, buffer layer 105 may be deposited and/or grown on carrier 104. Furthermore, buffer layer 105 may include any suitable materials as discussed herein such as a stack of layers including one or more of aluminum nitride, silicon nitride, gallium nitride, or the like.

Patterned layer 305 may include any suitable material or materials such as insulator materials. In an embodiment, patterned layer 305 is silicon nitride. Patterned layer 305 may be patterned to form openings 302, 303, 304 using any suitable technique or techniques such as lithography and etch techniques. Patterned layer 305 may have any thickness such as a thickness in the range of about 500 nanometers to 3 microns. For example, the thickness of patterned layer 305 may be selected to provide a desired height of electron transport layer cores 111, 121, 131. Openings 302, 303, 304 may have any suitable dimensions (e.g., length and widths parallel to carrier 104) such as a length in the range of 1 to 10 microns and a width in the range of about 500 nm to 2 microns. For example, the dimensions of openings 302, 303, 304 may be selected to provide a desired width and length of electron transport layer cores 111, 121, 131. Openings 302, 303, 304 may be (from a top down view) square or rectangular openings or the like. In some examples, openings 302, 303, 304 may be characterized as trenches and/or patterned layer 305 may be characterized as a mask layer.

Figure 3B:
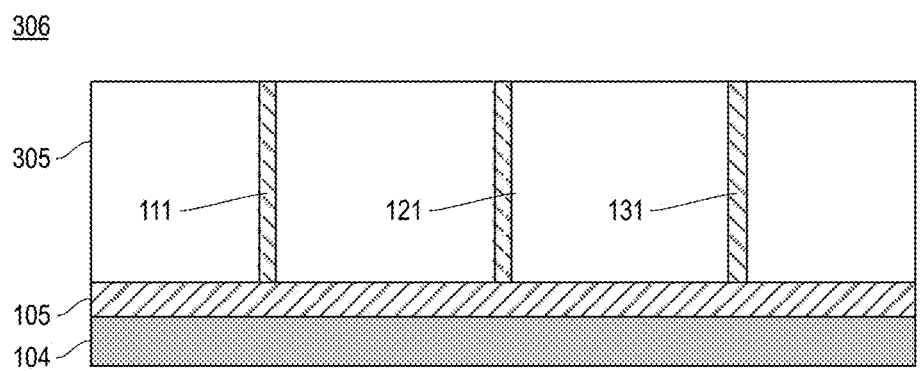

FIG. 3B illustrates a light emitting diode structure 306 similar to light emitting diode structure 301, after the formation of electron transport layer cores 111, 121, 131. Electron transport layer cores 111, 121, 131 may be formed using any suitable technique or techniques such as metal-organic chemical vapor deposition, metal-organic vapor phase epitaxy, or the like. In some embodiments, electron transport layer cores 111, 121, 131 may be n-doped gallium nitride as discussed herein. In an embodiment, may be transport layer cores 111, 121, 131 may be n-doped gallium nitride grown at a low temperature (e.g., not greater than 400° C.) by supplying nitrogen via ammonia ($NH_3$) or hydrazine ($N_2H_2$). In an embodiment, a chemical mechanical polish operation may be performed after the formation of electron transport layer cores 111, 121, 131.

Figure 3C:
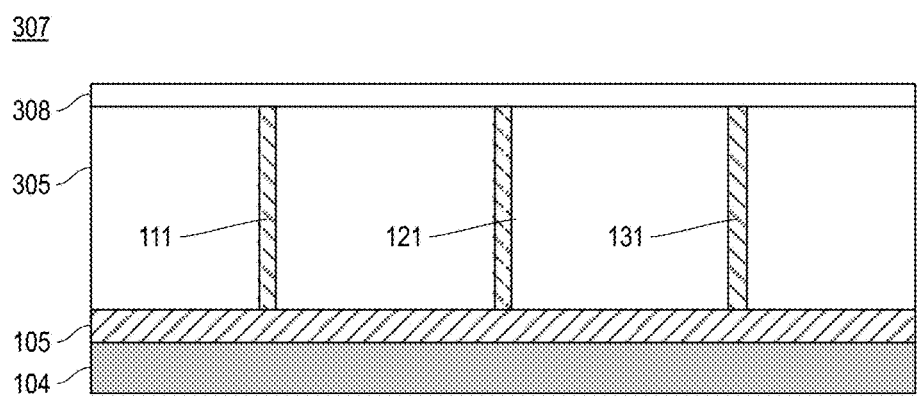

FIG. 3C illustrates a light emitting diode structure 307 similar to light emitting diode structure 306, after the formation of blocking layer 308. Blocking layer 308 may include any suitable material or materials that may block the subsequent growth of active emission layers 112, 122, 132 having any suitable thickness. For example, blocking layer 308 may be a silicon dioxide layer having a thickness in the range of about 20 to 50 nanometers. Blocking layer 308 may be formed using any suitable technique or techniques such as plasma enhanced vapor deposition followed by a chemical mechanical polish operation or the like.

Figure 3D:
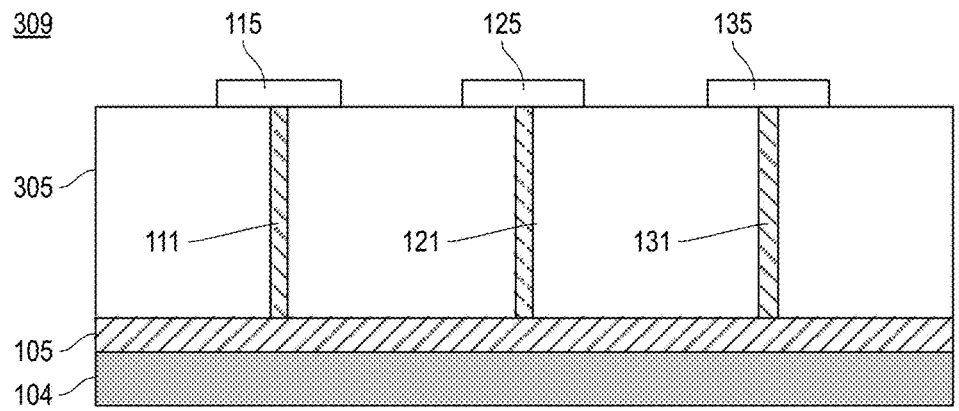

FIG. 3D illustrates a light emitting diode structure 309 similar to light emitting diode structure 307, after the patterning of blocking layer 308 to provide end cap layers 115, 125, 135. End cap layers 115, 125, 135 may be patterned using any suitable technique or techniques such as lithography and etch techniques or the like. As is discussed below, end cap layers 115, 125, 135 as formed from blocking layer 308 may block growth on the top surface of electron transport layer cores 111, 121, 131. For example, end cap layers 115, 125, 135 may be disposed on distal ends of electron transport layer cores 111, 121, 131 prior to removing portions of patterned layer 305 as discussed with respect to FIG. 3E.

Figure 3E:
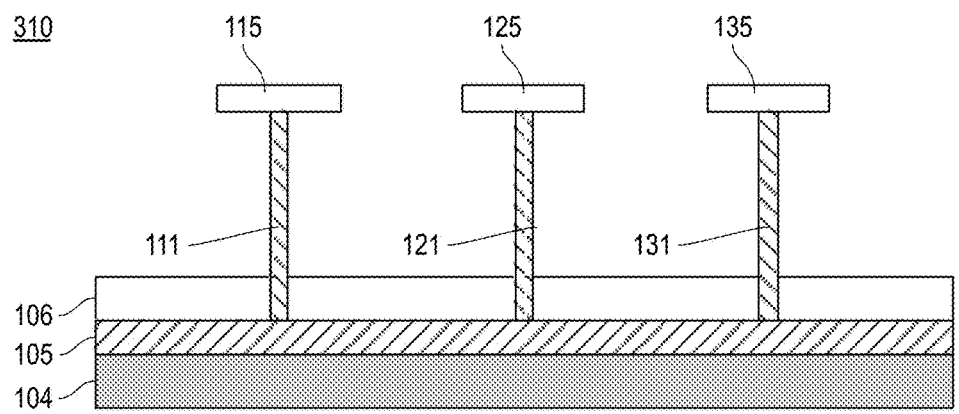

FIG. 3E illustrates a light emitting diode structure 310 similar to light emitting diode structure 309, after the removal of portions of patterned layer 305 to expose portions of electron transport layer cores 111, 121, 131 and provide dielectric layer 106 as discussed herein. The removed portions of patterned layer 305 may be removed using any suitable technique or techniques such as selective wet etch techniques or the like. In an embodiment, discussed patterned layer 305 is silicon nitride and end cap layers 115, 125, 135 are silicon oxide and a wet etch selective to silicon nitride may be performed. In an embodiment, the wet etch may be timed wet etch to leave a desired thickness of dielectric layer 106. In an embodiment, the wet etch may include an initial wet etch using hot phosphorus acid and a subsequent wet etch with diluted hydrofluoric acid.

Figure 3F:
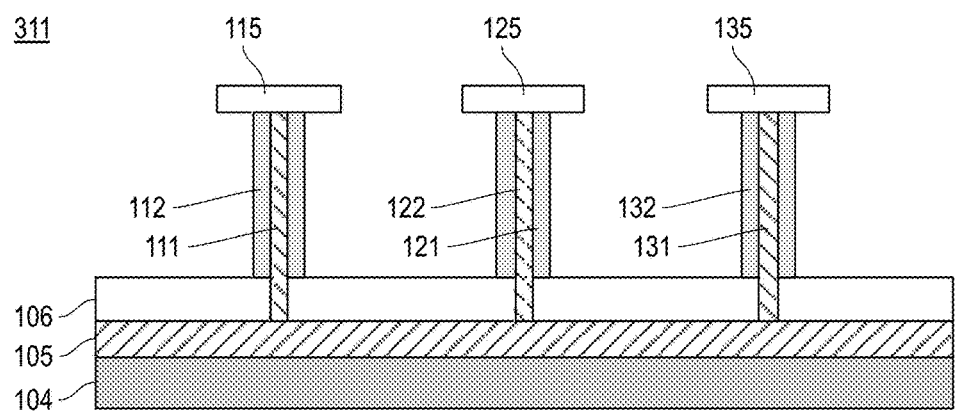

FIG. 3F illustrates a light emitting diode structure 311 similar to light emitting diode structure 310, after the selective growth of active emission layers 112, 122, 132. Active emission layers 112, 122, 132 may be formed using any suitable technique or techniques. In an embodiment, active emission layers 112, 122, 132 are formed using selective epitaxy operations such that active emission layers 112, 122, 132 are grown selective to only electron transport layer cores 111, 121, 131. Active emission layers 112, 122, 132 may include any suitable material or materials such as one or more layers of indium gallium nitride and one or more layers of gallium nitride. For example, active emission layers 112, 122, 132 may include alternating layers of indium gallium nitride and gallium nitride such that the concentration of indium in the indium gallium nitride layer(s) determines the light band of the resultant micro LED. As discussed, an indium concentration of about 41% may provide a red band, an indium concentration of about 37% may provide a green band, and an indium concentration of about 20% may provide a blue band.

Figure 3G:
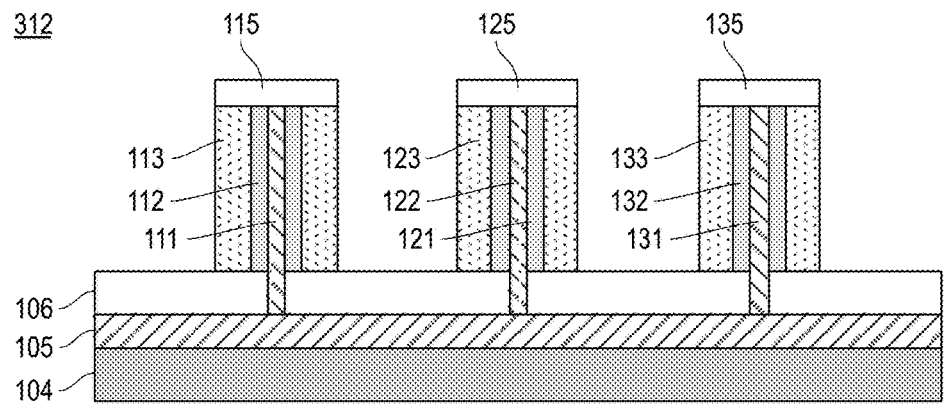

FIG. 3G illustrates a light emitting diode structure 312 similar to light emitting diode structure 311, after the selective growth of hole transport layers 113, 123, 133. Hole transport layers 113, 123, 133 may be formed using any suitable technique or techniques such as selective epitaxy techniques such that hole transport layers 113, 123, 133 are grown selective to only active emission layers 112, 122, 132. Hole transport layers 113, 123, 133 may include any suitable material or materials such as p-doped gallium nitride as discussed herein. In an embodiment, hole transport layers 113, 123, 133 may be formed using metal-organic chemical vapor deposition or the like. As shown, light emitting diode structure 312 may be formed without etching any of electron transport layer cores 111, 121, 131, active emission layers 112, 122, 132, or hole transport layers 113, 123, 133. Such fabrication techniques may offer the advantages of reduced damage to the micro light emitting diodes and increased efficiency in operation.

Figure 3H:
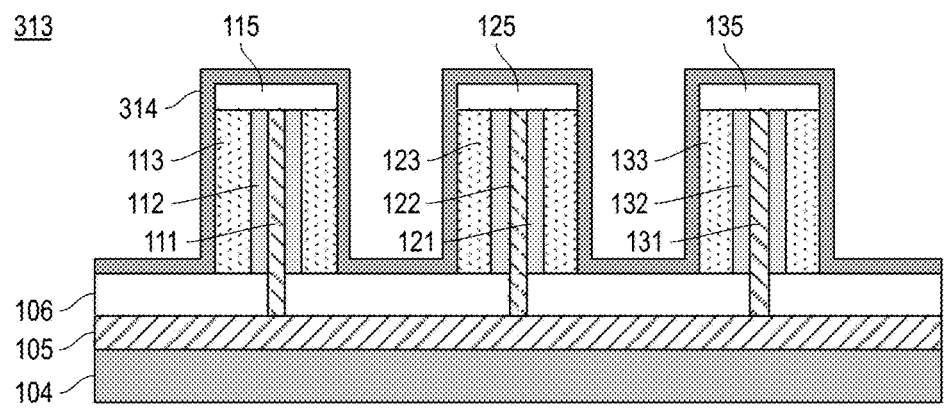

FIG. 3H illustrates a light emitting diode structure 313 similar to light emitting diode structure 312, after the formation of cladding layer 314. Cladding layer 314 may be formed on end cap layers 115, 125, 135, sidewalls of hole transport layers 113, 123, 133 (e.g., also over electron transport layer cores 111, 121, 131 and active emission layers 112, 122, 132), and exposed portions of dielectric layer 106 using any suitable technique or techniques such as electroplating techniques, physical vapor deposition techniques or the like. Cladding layer 314 may include any suitable material or materials such as aluminum, silver, copper, or the like. For example, cladding layer 314 may be a metal layer. As discussed, cladding layer 314 (i.e., reflective claddings 114, 124, 134) reflect light emitted from active emission layers 112, 122, 132 (e.g., multi-quantum wells) of micro light emitting diodes 101, 102, 103 toward buffer layer 105). Furthermore, in some embodiments, the light emitted from micro light emitting diodes 101, 102, 103 is superlambertian.

Figure 3I:
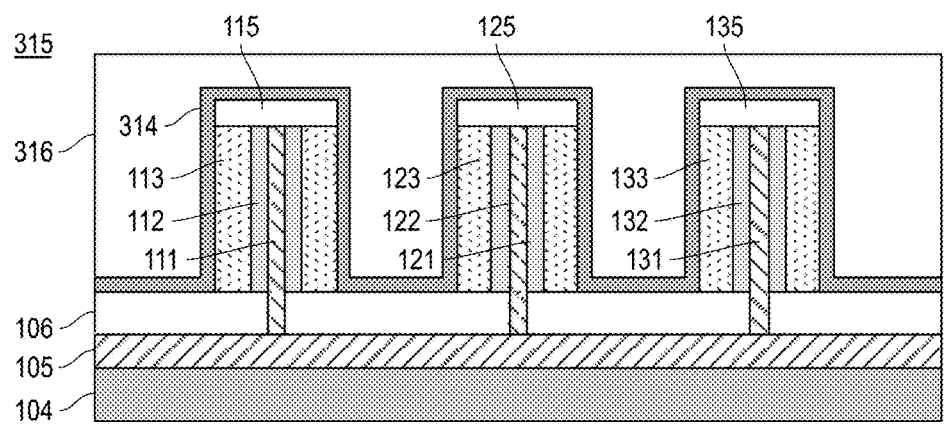

FIG. 3I illustrates a light emitting diode structure 315 similar to light emitting diode structure 313, after the formation of planarization layer 316. Planarization layer 316 may provide a planar surface for subsequent patterning of cladding layer 314. Planarization layer 316 may include any suitable material or materials and planarization layer 316 may be formed using any suitable technique or techniques. For example, planarization layer 316 may be silicon dioxide formed by plasma enhanced chemical vapor deposition and chemical mechanical polishing.

Figure 3J:
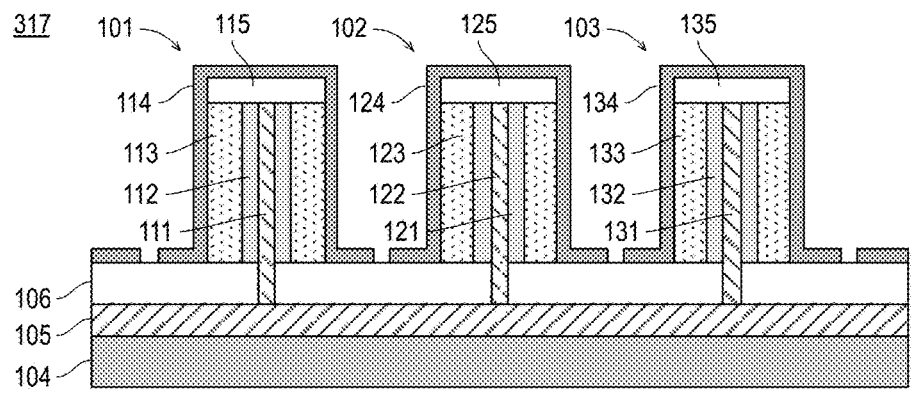

FIG. 3J illustrates a light emitting diode structure 317 similar to light emitting diode structure 315, after the patterning of cladding layer 314 to provide reflective claddings 114, 124, 134 and the removal of planarization layer 316. Cladding layer 314 may be patterned to form reflective claddings 114, 124, 134 using any suitable technique or techniques. For example, planarization layer 316 may be patterned using lithography and etch operations to provide openings in planarization layer 316 and the openings may be used to etch exposed portions of metal layer to provide reflective claddings 114, 124, 134. As shown, reflective claddings 114, 124, 134 may isolate micro light emitting diodes 101, 102, 103.

Figure 3K:
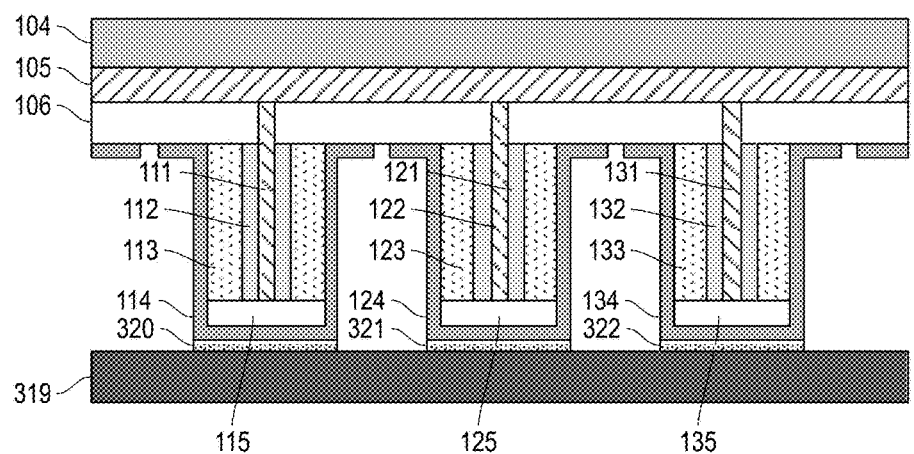

FIG. 3K illustrates a light emitting diode structure 318 similar to light emitting diode structure 317, after the bonding of light emitting diode structure 317 to driver circuit 319. Light emitting diode structure 317 may be bonded to driver circuit 319 using any suitable technique or techniques. For example, as shown, driver circuit 319 may include conductive electrodes 320, 321, 322, which may be bonded to reflective claddings 114, 124, 134, respectively. Driver circuit 319 may include any suitable circuitry and/or structures for driving micro light emitting diodes 101, 102, 103 during operation such as transistors, control circuitry, or the like. For example, driver circuit 319 may be provided as a wafer, a thin film transistor device, or the like. In the illustrated example, light emitting diode structure 317 may be bonded to driver circuit 319 using wafer bonding techniques. In other examples, driver circuit 319 may be formed by monolithic integration of a thin film transistor (e.g., polysilicon, amorphous silicon, organic TFTs, etc.).

Figure 3L:
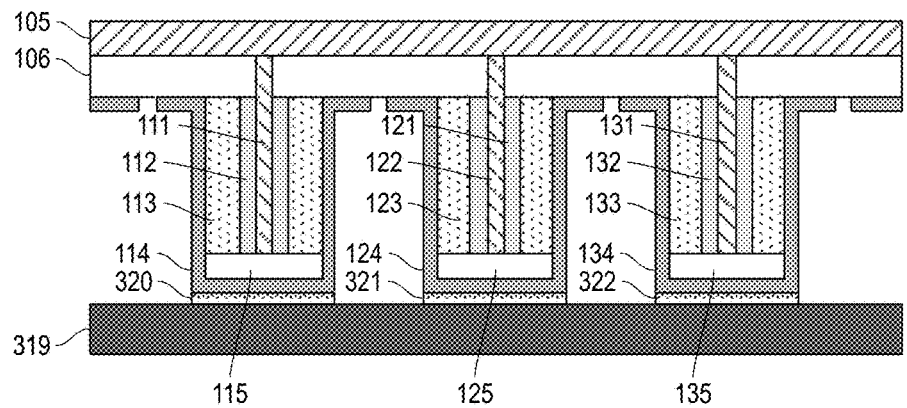

FIG. 3L illustrates a light emitting diode structure 323 similar to light emitting diode structure 318, after the removal of carrier 104. Carrier 104 may be removed using any suitable technique or techniques such as polish techniques, wet etch techniques, UV light release techniques, or the like.

Figure 3M:
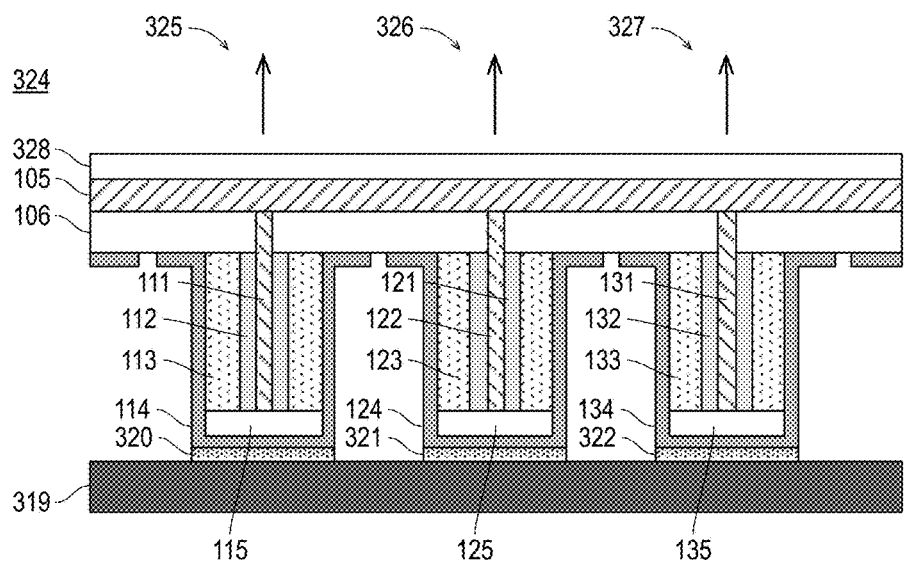

FIG. 3M illustrates a light emitting diode structure 324 similar to light emitting diode structure 323, after formation of common electrode 328. Electrode 328 may be formed using any suitable technique or techniques. In an embodiment, electrode 328 is indium tin oxide (ITO) deposited using physical vapor deposition and patterned, as needed, using lithography and etch techniques or the like. As shown, In an embodiment, electrode 328 is disposed on buffer layer 105. As shown, in operation, light emitting diode structure 324 may provide bands of light 325, 326, 327 (e.g., bands of red, green, and blue light) as discussed herein.

As shown, the operations corresponding to FIGS. 3K-3L may provide a bonding technique such that all of micro light emitting diodes 101, 102, 103 are flip bonded to driver circuit 319. In other embodiments, micro light emitting diodes 101, 102, 103 may be transferred from carrier 104 to a separate driver circuit 319 or glass substrate or the like using direct transfer techniques or stamp transfer techniques or the like. For example, each or a group of micro light emitting diodes 101, 102, 103 may be picked using an adhesive or silicone such a polydimethylsiloxane, an electrostatic bonding, an electromagnetic bonding, a vacuum bonding, or the like, and placing them on a glass substrate or the like. In some embodiments, as discussed, each of micro light emitting diodes 101, 102, 103 may emit the same band of light in operation (e.g., red light). In such embodiments, separate light emitting diode structure s each to emit other bands (e.g., green and blue) may be fabricated and the red, green, and blue micro light emitting diodes from the separate light emitting diode structure s may be assembled or onto the same glass substrate as an array of micro LEDs or the like to provide an RGB capable display.

Figure 4:
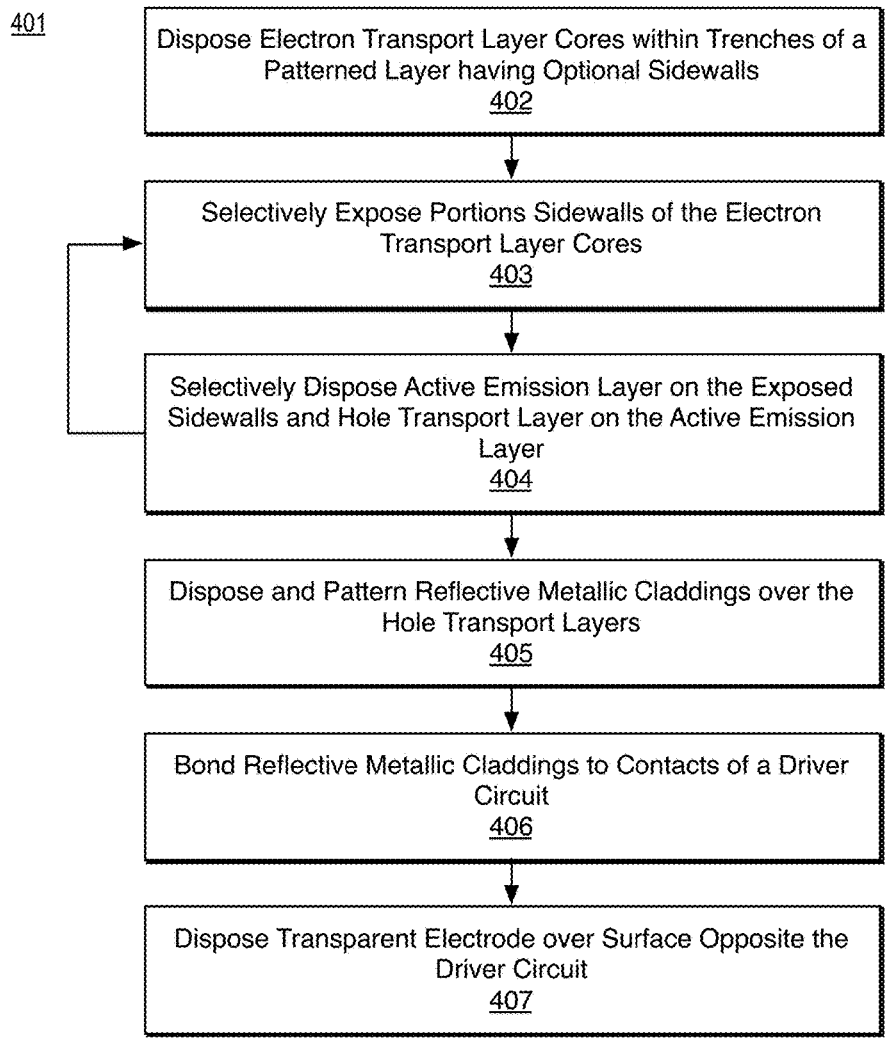
FIG. 4 is a flow diagram illustrating an example process for fabricating a light emitting diode device.

FIG. 4 is a flow diagram illustrating an example process 401 for fabricating a light emitting diode device, arranged in accordance with at least some implementations of the present disclosure. For example, process 401 may be implemented to any suitable light emitting diode structure discussed herein such as light emitting diode structure 434. In the illustrated implementation, process 401 may include one or more operations as illustrated by operations 402-407. However, embodiments herein may include additional operations, certain operations being omitted, or operations being performed out of the order provided.

Process 401 may begin at operation 402, where electron transport layer cores may be disposed within trenches of a patterned layer over a substrate such that the patterned layer may include optional sidewalls. The patterned layer may include any suitable material or materials such as silicon nitride and may be patterned using any suitable technique or techniques photolithography and etch techniques. The optional sidewalls may formed using any suitable technique or techniques such as conformal material deposition followed by directional etch techniques or the like. The electron transport layer cores may be disposed within the trenches using any suitable technique or techniques such as metal-organic chemical vapor deposition, metal-organic vapor phase epitaxy, or the like. In an embodiment, one or more of electron transport layer cores 111, 121, 131 may be disposed within trenches of a patterned layer having sidewalls as discussed herein with respect to FIGS. 5A-5C. In an embodiment, one or more of electron transport layer cores 111, 121, 131 may be disposed within trenches of a patterned layer as discussed herein with respect to FIGS. 6A and 6B.

Process 401 may continue at operation 403, where at least a portion of the patterned layer may be removed to selective expose portions of sidewalls of an electron transport layer core. For example, an electron transport layer core or cores corresponding to a micro light emitting diode or diodes being fabricated to emit a particular band of light (e.g., red, green, or blue) may be selectively exposed while other electron transport layer cores corresponding to micro light emitting diodes being fabricated to emit another particular band of light remain covered by the patterned layer (and/or other materials). Using such selective electron transport layer core exposure techniques iteratively as shown, each type of micro light emitting diodes (e.g., by color band) may be fabricated in turn. For example, operations 403 and 404 may be repeated any number of times to fabricate any number of types of micro light emitting diodes for emitting different bands of light. As discussed herein, the band of light emitted by each type of micro light emitting diode may be determined by the active emission layer (e.g., the concentration of indium in the indium gallium nitride layer(s) of the active emission layer) fabricated at operation 404.

The portion of the patterned layer (and a portion of any sidewall material, if applicable) may be removed using any suitable technique or techniques such as wet etch techniques or the like. In some embodiments, an end cap layer may be patterned over the electron transport layer core and the patterned layer may be removed by selective wet etching (e.g., with an etch selectively of the patterned layer with respect to the end cap layer). In an embodiment, portions of the patterned layer and portions of sidewall materials may be removed to expose one of electron transport layer cores 111, 121, 131 as discussed herein with respect to FIGS. 5E-5G, FIG. 5J, or FIG. 5M. In an embodiment, portions of the patterned layer and portions of sidewall materials may be removed to expose one of electron transport layer cores 111, 121, 131 as discussed herein with respect to FIGS. 6G-6I, FIGS. 6L and 6M, or FIGS. 6P and 6Q.

Process 401 may continue at operation 404, where an active emission layer may be disposed on the exposed sidewalls of the electron transport layer core and a hole transport layer may be disposed on the active emission layer. The active emission layer may be disposed on the exposed sidewalls of the electron transport layer core using any suitable technique or techniques such as selective epitaxy or the like. Similarly, the hole transport layer may be disposed on the exposed sidewalls of the electron transport layer core using any suitable technique or techniques such as selective epitaxy or the like. In an embodiment, one of active emission layers 112, 122, 132 may be disposed on the exposed portions of sidewalls of any of electron transport layer cores 111, 121, 131 and a corresponding one of hole transport layers 113, 123, 133 may be disposed on one of active emission layers 112, 122, 132 as discussed herein with respect to FIG. 5H, FIG. 5K, or FIG. 5N. In an embodiment, one of active emission layers 112, 122, 132 may be disposed on the exposed portions of sidewalls of any of electron transport layer cores 111, 121, 131 and a corresponding one of hole transport layers 113, 123, 133 may be disposed on one of active emission layers 112, 122, 132 as discussed herein with respect to FIG. 6J, FIG. 6N, or FIG. 6R.

As shown, process 401 may optionally continue at operation or operation 405. For example, if additional types of micro light emitting diodes are to be fabricated by exposing their electron transport layer cores and forming corresponding active emission layers and hole transport layers, processing may continue at operation 403 where such selective exposure of the electron transport layer cores may be performed and at operation 404 where such selective fabrication of active emission layers and hole transport layers may be provided. For example, operations 403 and 404 may be repeated three times to fabricate red, blue, and green (in any order) micro light emitting diodes in turn. In an embodiment, at each iterative operation 404, the indium concentration in one or more indium gallium nitride layers of active emission layers 112, 122, 132 may be modified as discussed herein to effectuate the band of light emitted by the micro light emitting diodes in operation. For example, an indium concentration of about 41% may provide a red color micro LED, an indium concentration of about 37% may provide a green color micro LED, and an indium concentration of about 20% may provide a blue color micro LED. In an embodiment, the fabrication of each type of micro LED may otherwise be the same or similar. When each type of micro light emitting diodes are fabricated (e.g., front end fabricated through hole transport layer formation), processing may continue at operation 405.

At operation 405, a reflective cladding such as a reflective metal cladding may be disposed over the hole transport layers and patterned. The reflective cladding may be disposed and patterned using any suitable technique or techniques. For example, the reflective cladding may be disposed using electroplating or physical vapor deposition techniques and patterned by applying a planar surface, patterning the planar surface, and etching cladding exposed by the patterned planar surface. In an embodiment, reflective claddings 114, 124, 134 may be disposed on end caps 114, 124, 134 and hole transport layers 113, 123, 133 and patterned as discussed herein with respect to FIGS. 5Q-5T. In an embodiment, reflective claddings 114, 124, 134 may be disposed on end caps 114, 124, 134 and hole transport layers 113, 123, 133 and patterned as discussed herein with respect to FIGS. 6U and 6V.

Process 401 may continue at operation 406, where the reflective cladding may be bonded to contacts or conductive electrodes or the like of a driver circuit. The reflective cladding may be bonded to the conductive electrode using any suitable technique or techniques. For example, the carrier including the micro light emitting diodes may be bonded to a substrate including the conductive electrodes. Although discussed with respect to bonding techniques, in other examples, the driver circuit may be formed by monolithic integration of a thin film transistor (e.g., polysilicon, amorphous silicon, organic TFTs, etc.) or the like. In an embodiment, reflective claddings 114, 124, 134 may be disposed on contacts or conductive electrodes of a driver circuit as discussed herein with respect to FIG. 5T. In an embodiment, reflective claddings 114, 124, 134 may be disposed on contacts or conductive electrodes of a driver circuit as discussed herein with respect to FIG. 6W.

Process 401 may continue at operation 407, where a transparent electrode may be disposed over a surface of the micro light emitting diode or of an emission surface opposite the driver circuit. The transparent electrode may be disposed using any suitable technique or techniques. For example, the transparent electrode may be deposited using physical vapor deposition and patterned, if needed, using lithography and etch techniques. In an embodiment, the transparent electrode may be disposed on buffer layer 105 subsequent to the removal of carrier 104 as discussed herein with respect to FIGS. 3L and 3M. In an embodiment, reflective claddings 114, 124, 134 may be disposed on contacts or conductive electrodes and the transparent electrode may be disposed on buffer layer 105 subsequent to the removal of carrier 104 as discussed herein with respect to FIG. 5T. In an embodiment, reflective claddings 114, 124, 134 may be disposed on contacts or conductive electrodes and the transparent electrode may be disposed on buffer layer 105 subsequent to the removal of carrier 104 as discussed herein with respect to FIG. 6W.

Process 401 may be utilized to generate any light emitting diode structure as discussed herein such as those discussed with respect to light emitting diode structure 100, light emitting diode structure 324, light emitting diode structure 535, light emitting diode structure 644, or any other light emitting diode structure discussed herein. In some embodiments, process 401 may generate multiple micro light emitting diodes configured to emit different bands of light (e.g., red, green, and blue LEDs).

As discussed, process 400 includes removing a portion of a patterned layer to selectively expose a portion or portions of sidewalls of an electron transport layer core such that the patterned layer protects another electron transport layer core during the formation of an emission layer on the exposed sidewalls of the electron transport layer core and the formation of a hole transport layer on the emission layer.

Figure 5A:
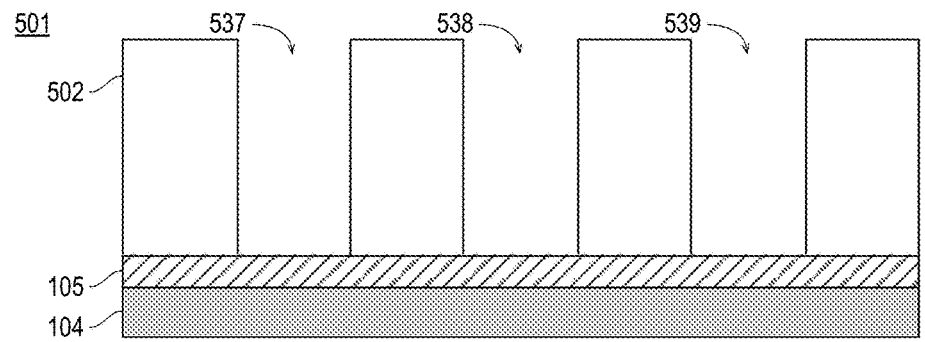
FIGS. 5A, 5B, 5C, 5D, 5E, 5F, 5G, 5H, 5I, 5J, 5K, 5L, 5M, 5N, 5O, 5P, 5Q, 5R, 5S, and 5T are cross-sectional views of example light emitting diode structure s as particular fabrication operations are performed.
Figure 5B:
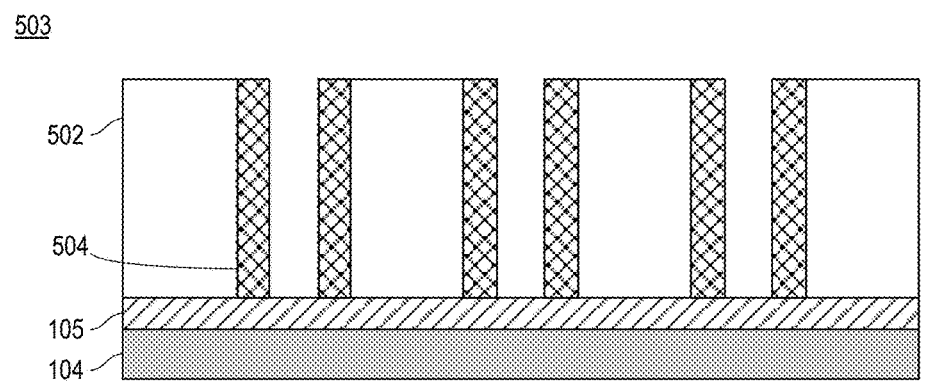
Figure 5C:
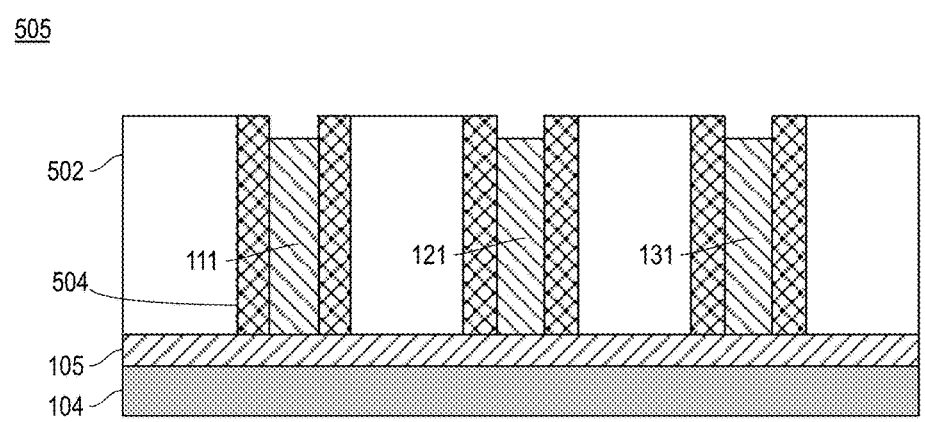
Figure 5D:
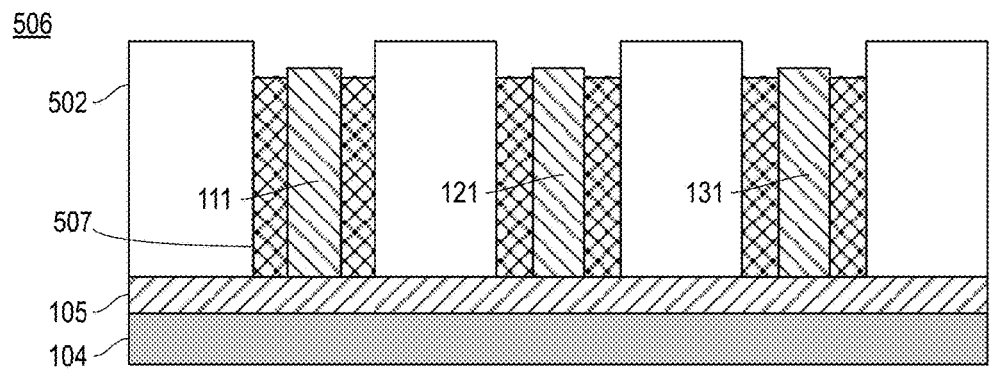
Figure 5E:
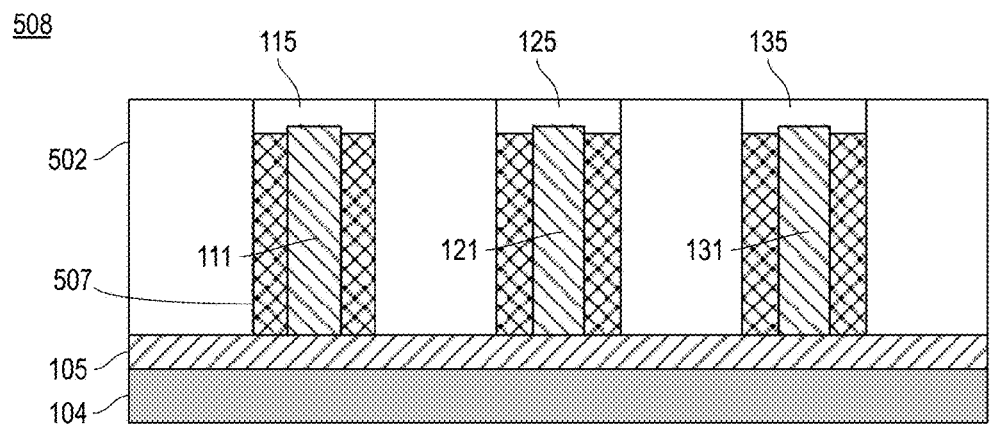
Figure 5F:
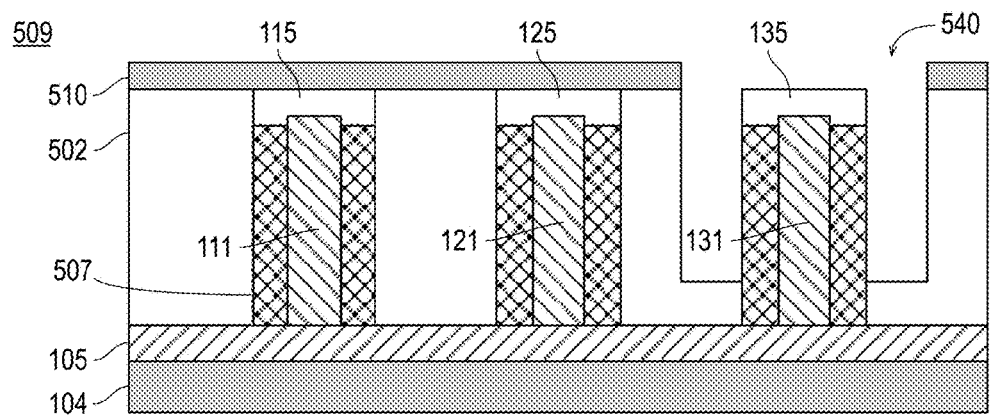
Figure 5G:
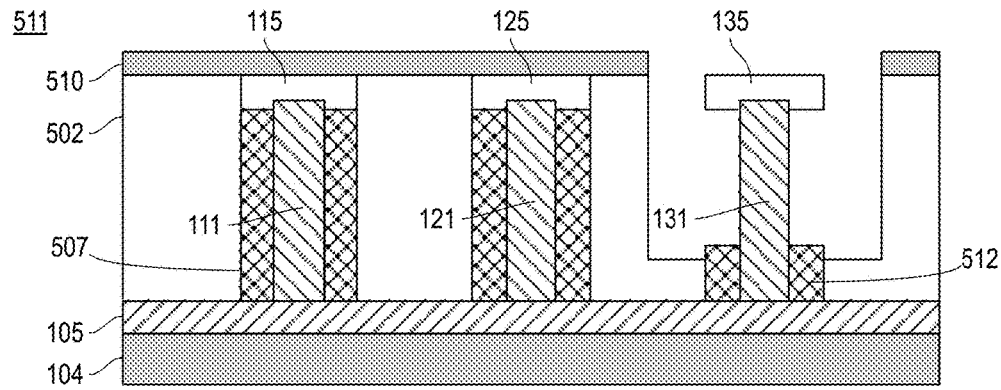
Figure 5H:
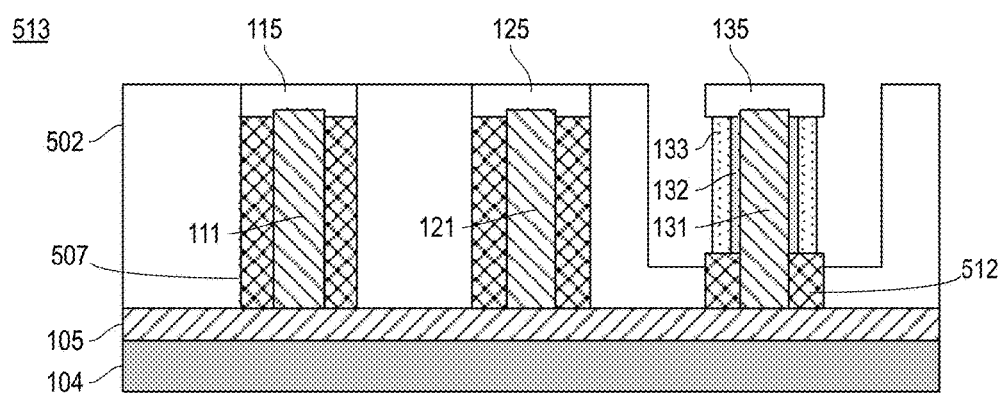
Figure 5I:
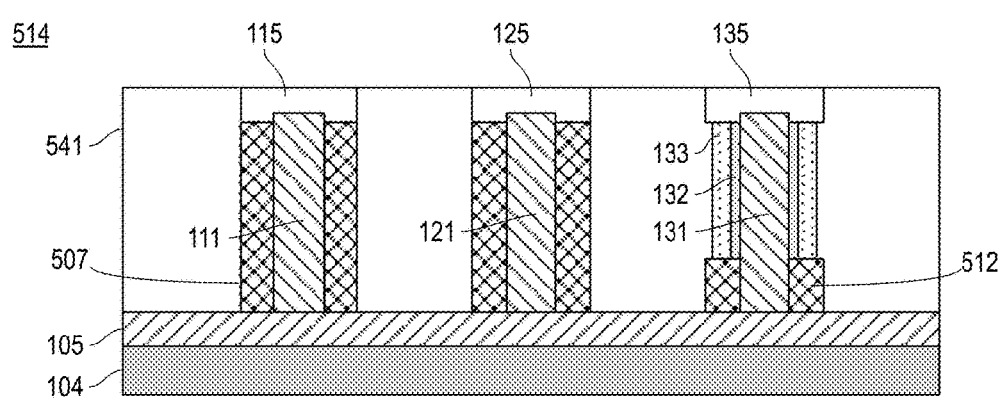
Figure 5J:
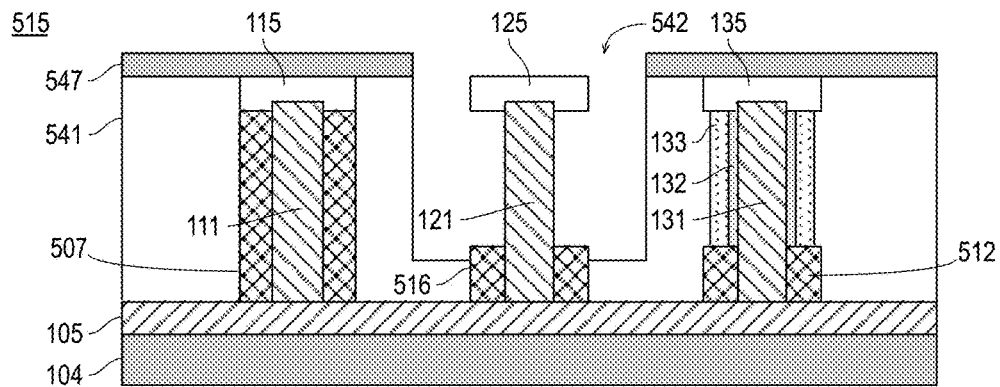
Figure 5K:
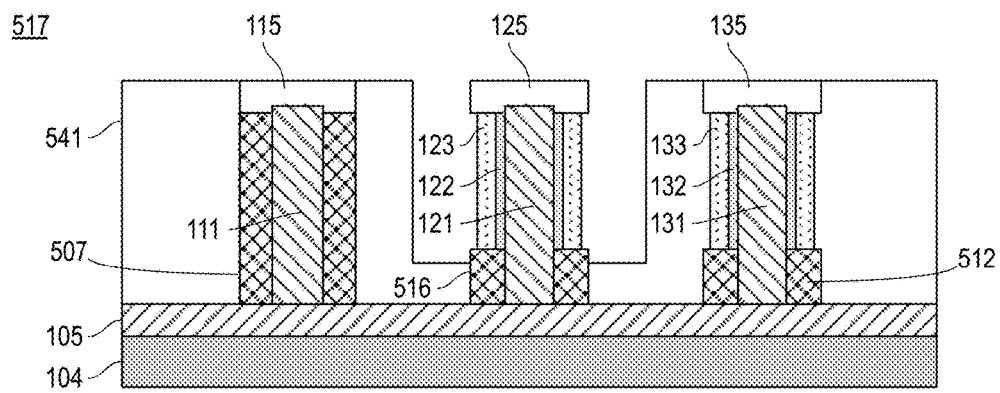
Figure 5L:
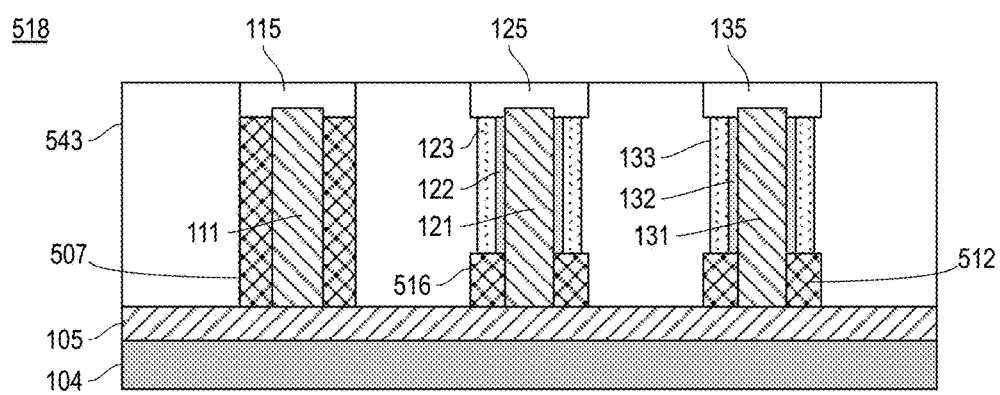
Figure 5M:
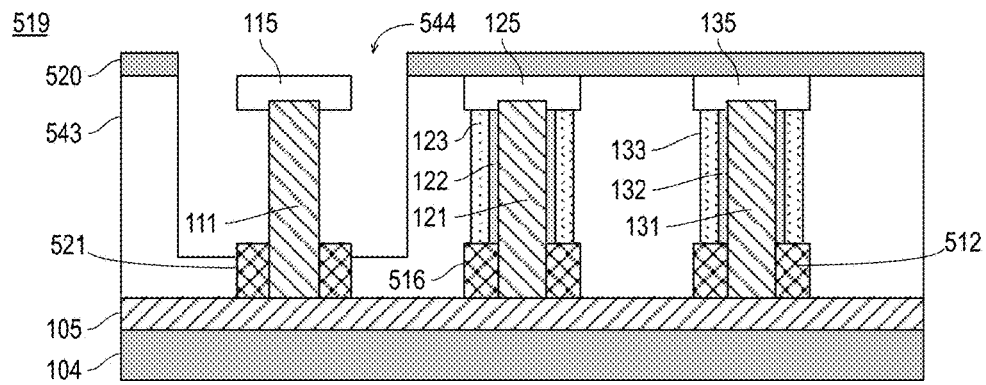
Figure 5N:
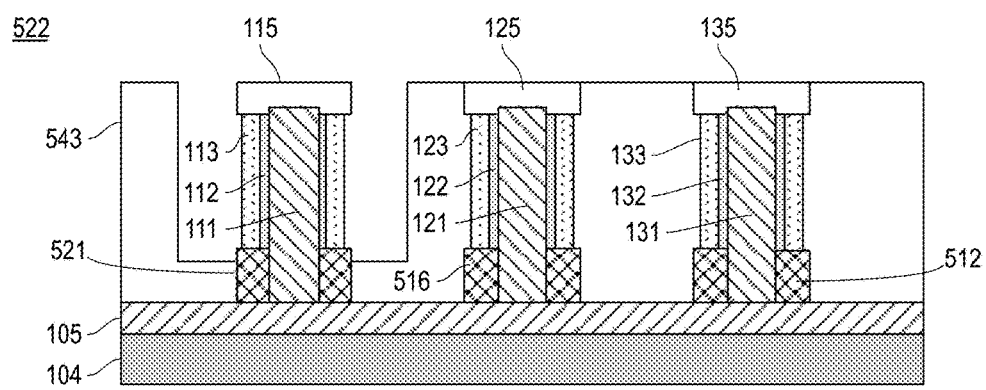
Figure 5O:
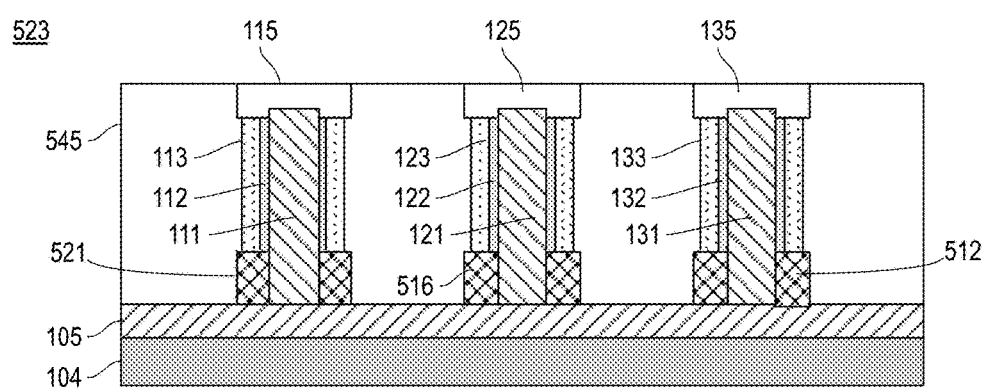
Figure 5P:
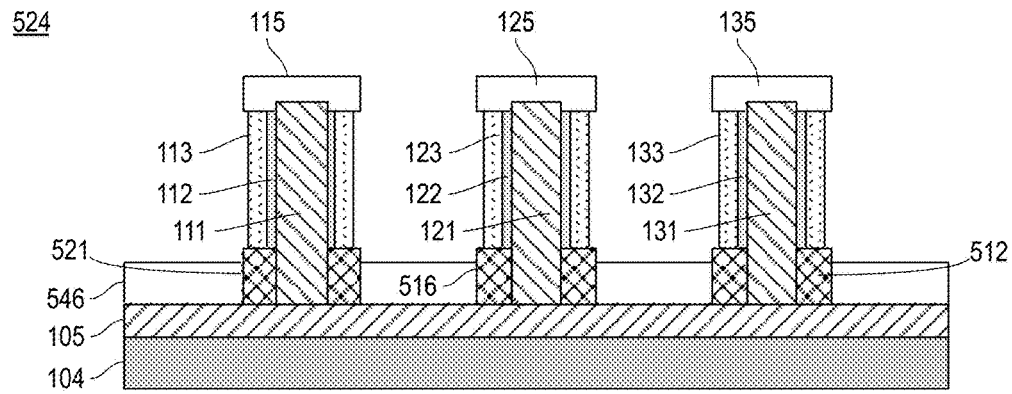
Figure 5Q:
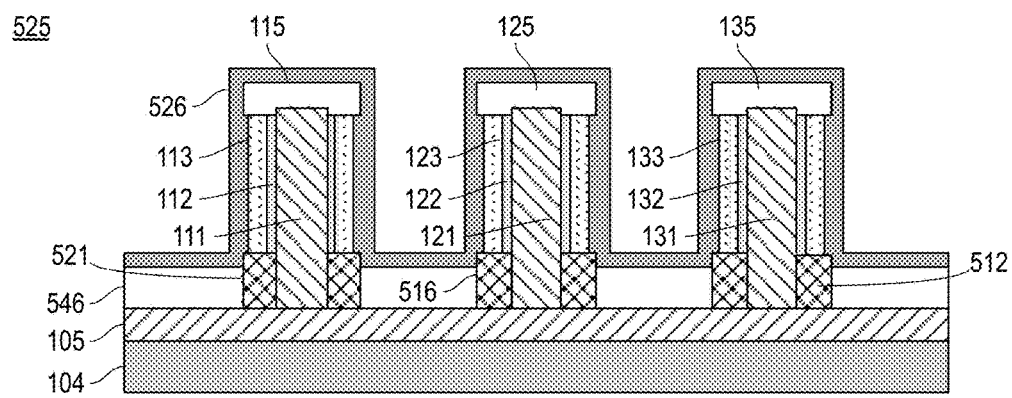
Figure 5R:
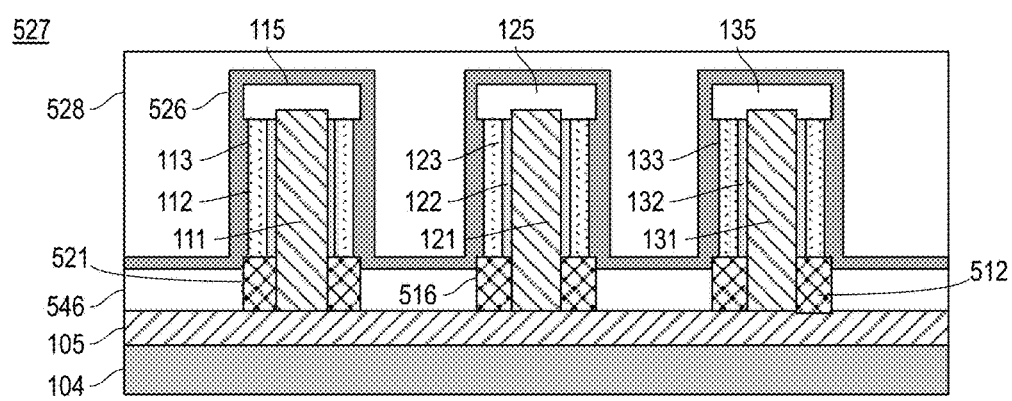
Figure 5S:
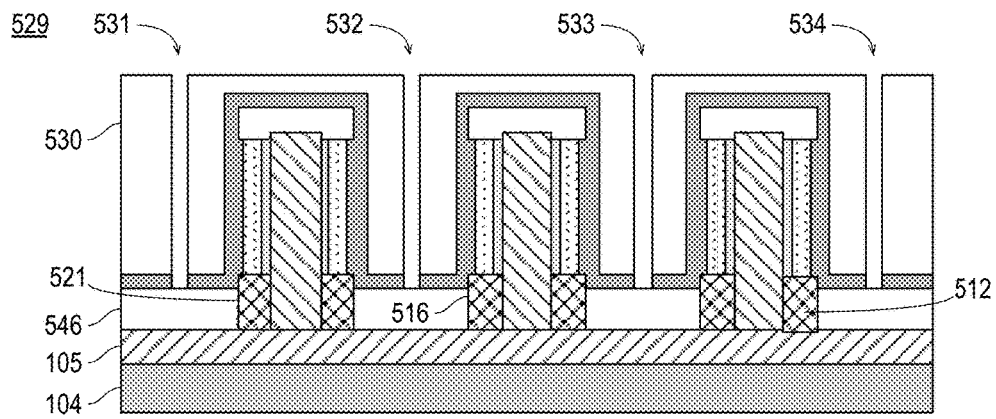
Figure 5T:
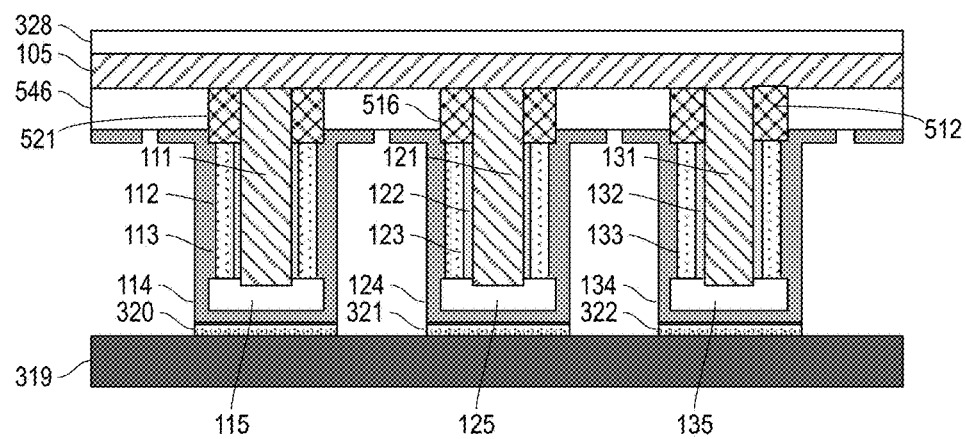

As discussed with respect to FIGS. 5A-5T, the patterned layer may include a first patterned layer having a first trench and a sidewall material within the first trench to provide the trench and removing the portion of the patterned layer to expose the portion or portions at least the portion of the sidewalls may include disposing an end cap over the electron transport layer core and the sidewall material, removing a portion of the first patterned layer, and removing a portion of the sidewall material. Furthermore, such operations may be repeated to expose a portion or portions of the previously protected electron transport layer core and an emission layer may be formed on that electron transport layer core such that the emission layer has different characteristics with respect to the previous emission layer as discussed further below.

Figure 6A:
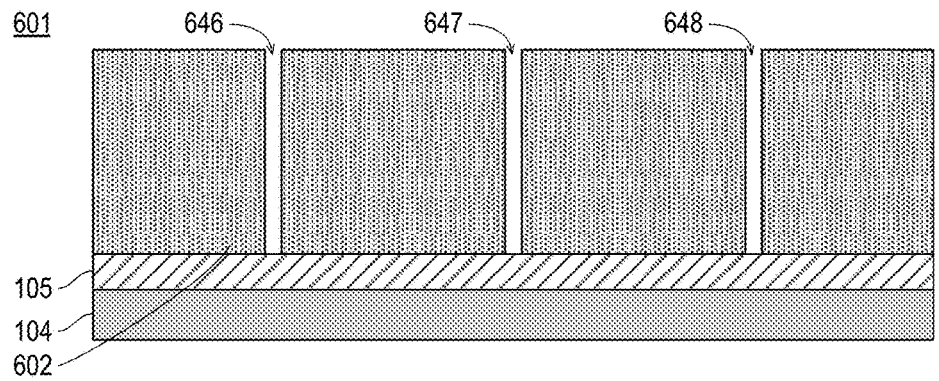
FIGS. 6A, 6B, 6C, 6D, 6E, 6F, 6G, 6H, 6I, 6J, 6K, 6L, 6M, 6N, 6O, 6P, 6Q, 6R, 6S, 6T, 6U, 6V, and 6W are cross-sectional views of example light emitting diode structure s as particular fabrication operations are performed.
Figure 6B:
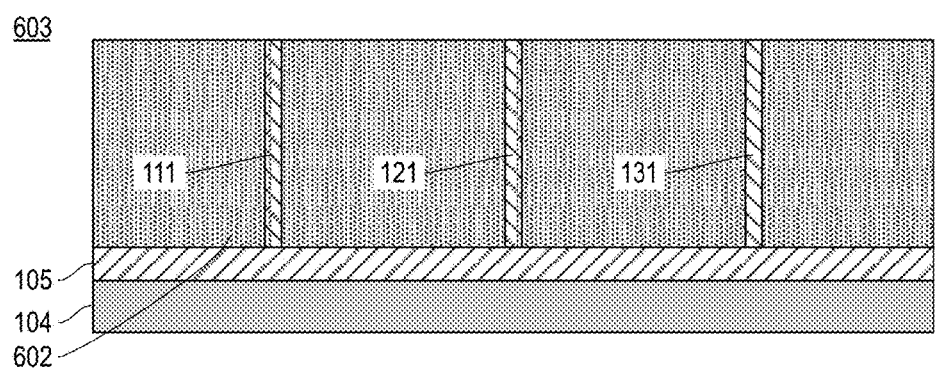
Figure 6C:
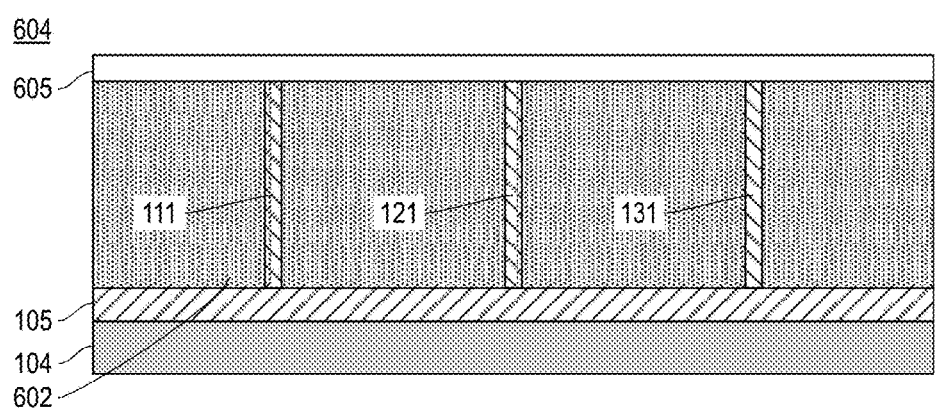
Figure 6D:
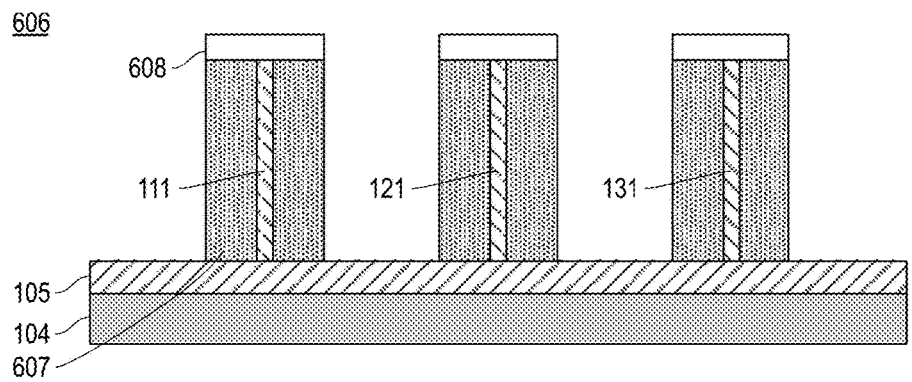
Figure 6E:
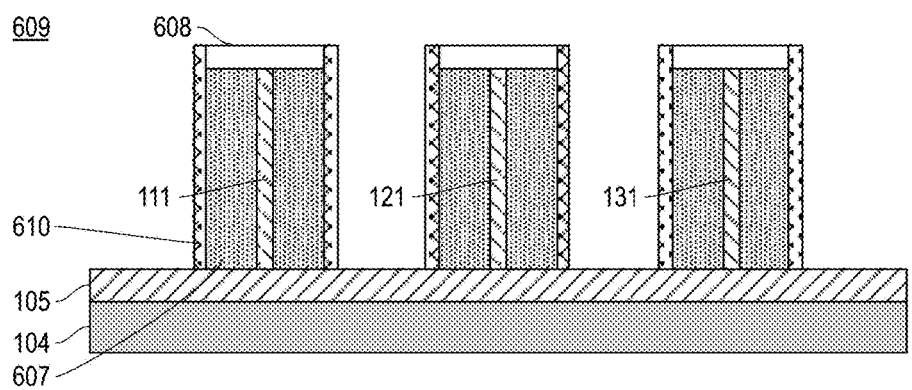
Figure 6F:
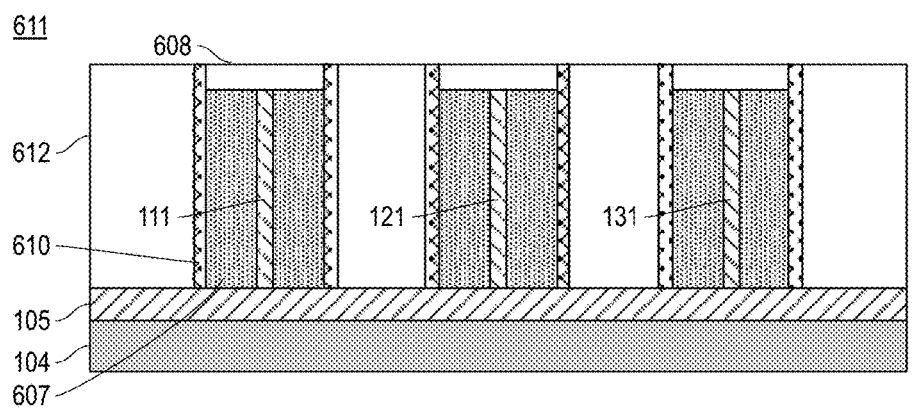
Figure 6G:
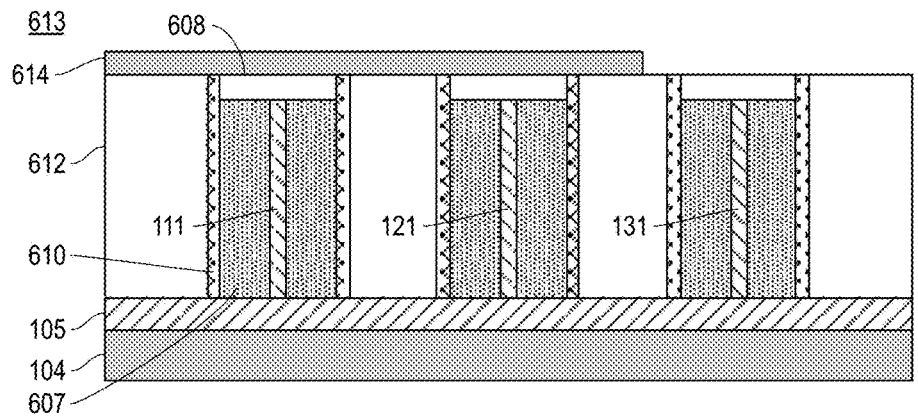
Figure 6H:
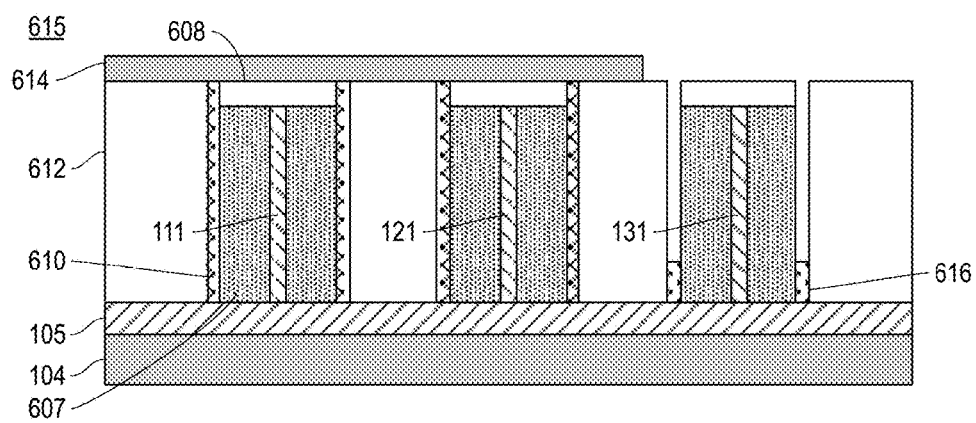
Figure 6I:
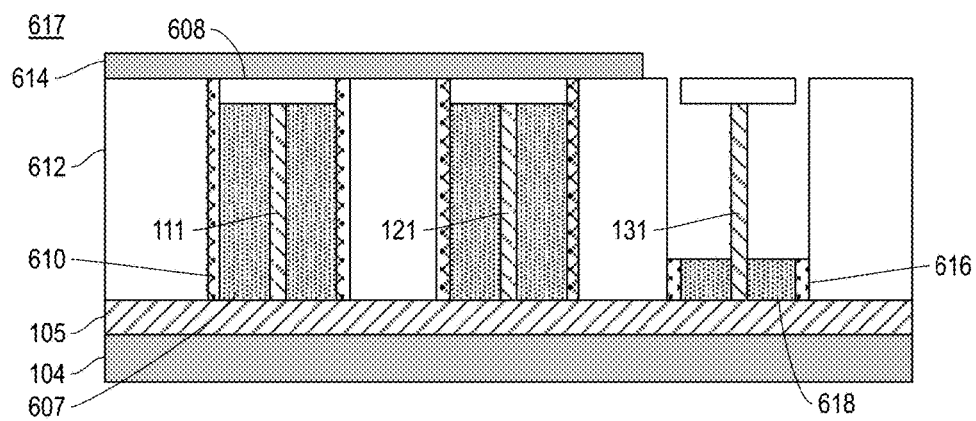
Figure 6J:
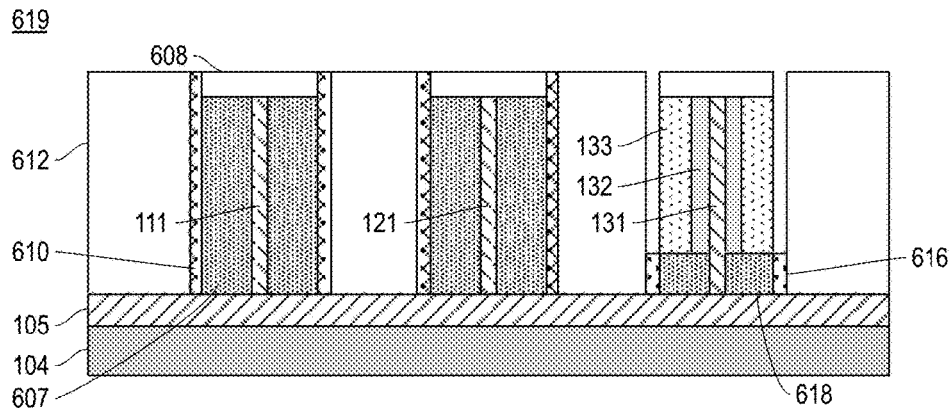
Figure 6K:
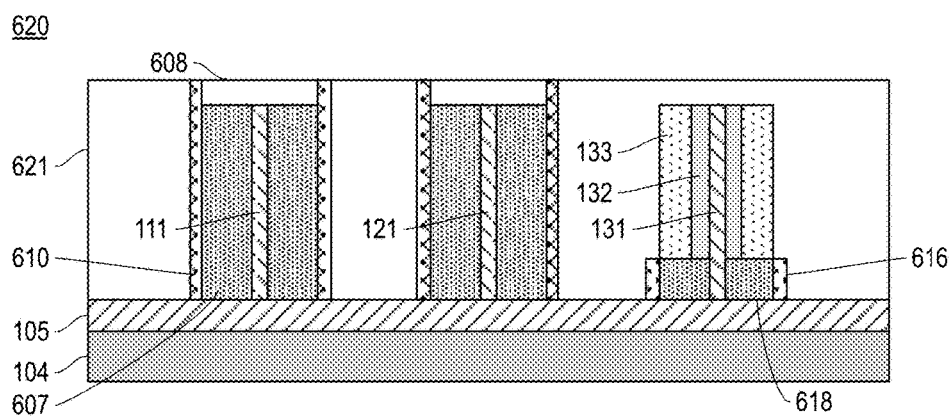
Figure 6L:
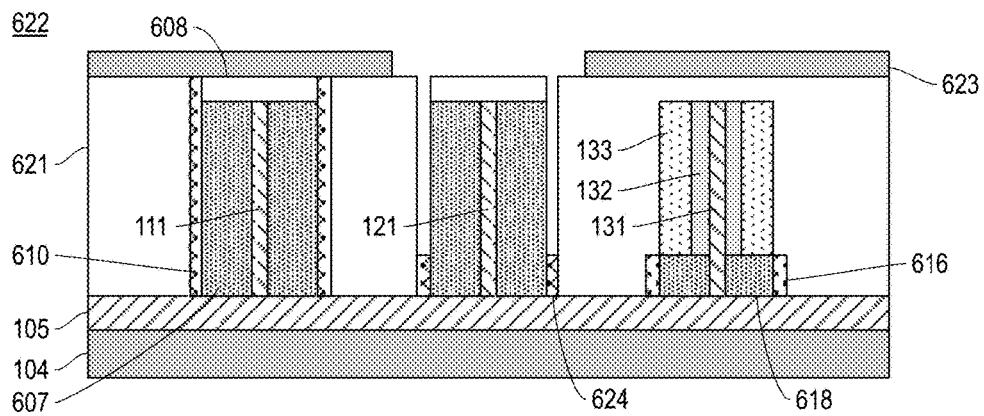
Figure 6M:
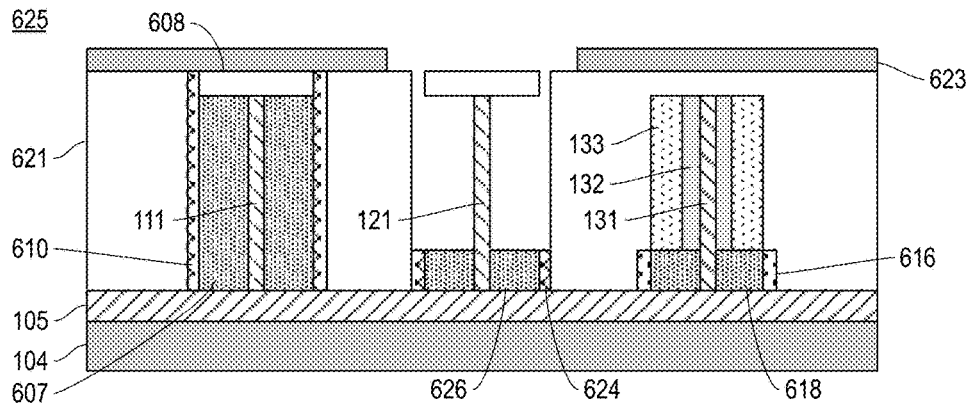
Figure 6N:
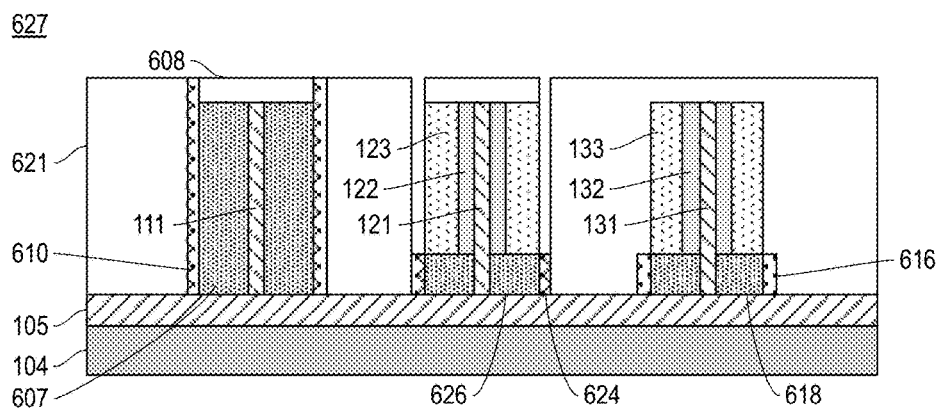
Figure 6O:
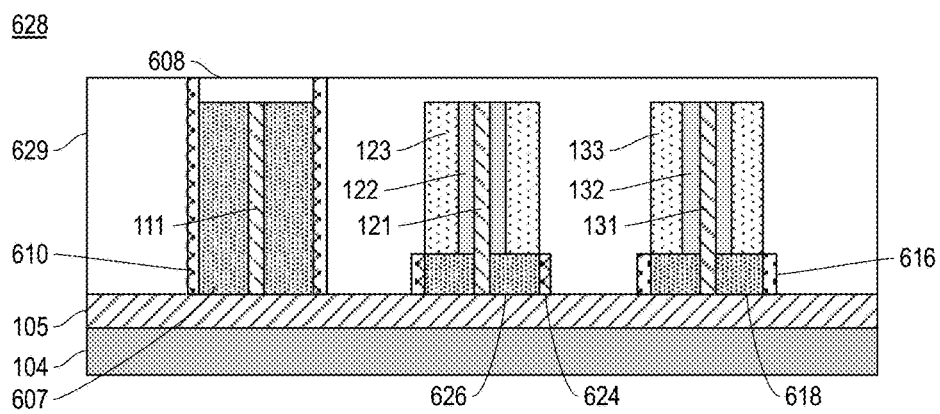
Figure 6P:
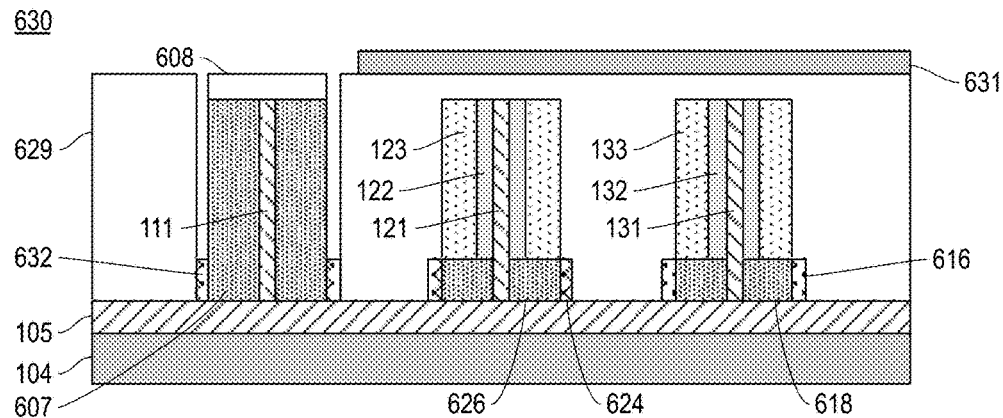
Figure 6Q:
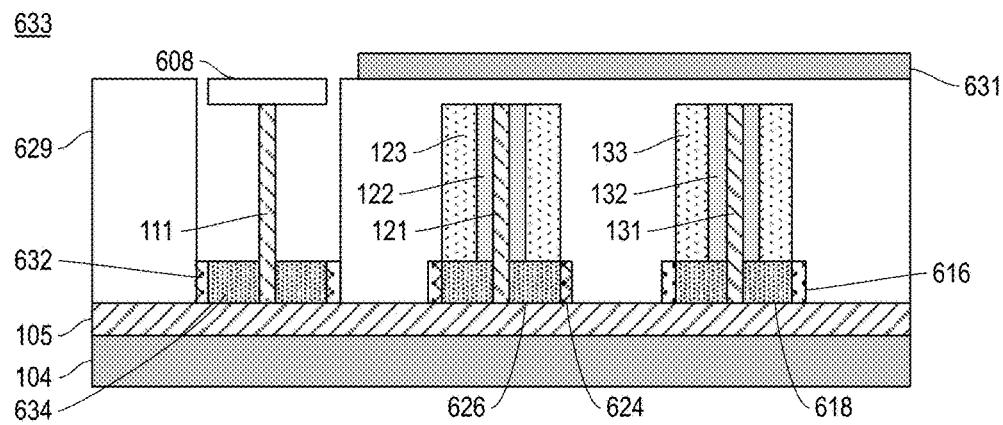
Figure 6R:
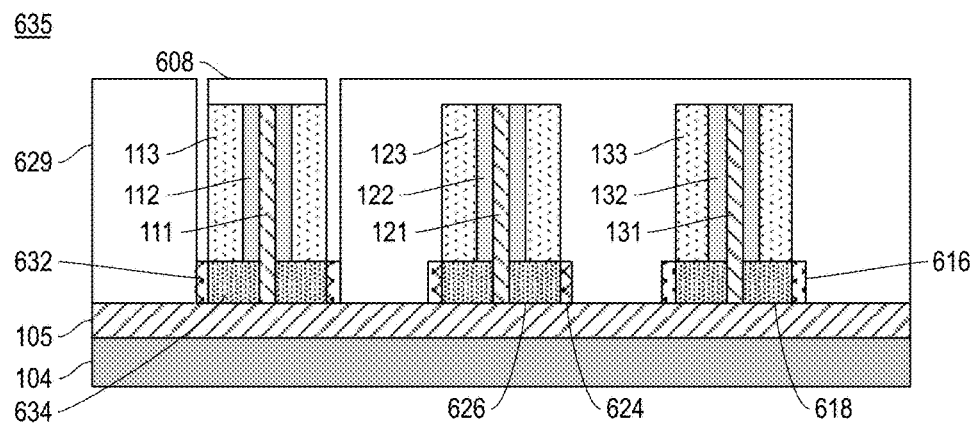
Figure 6S:
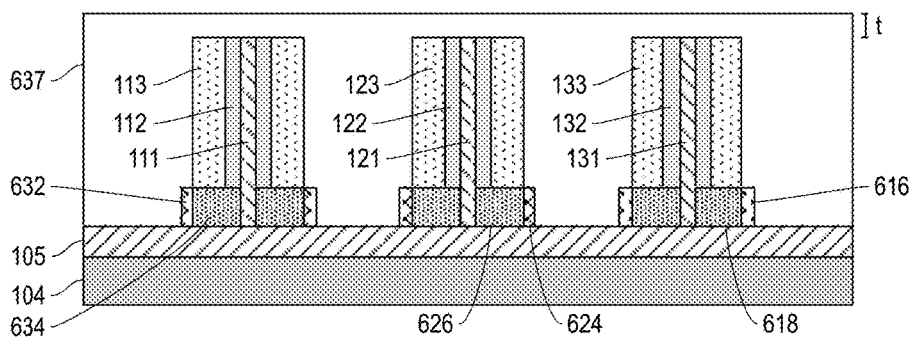
Figure 6T:
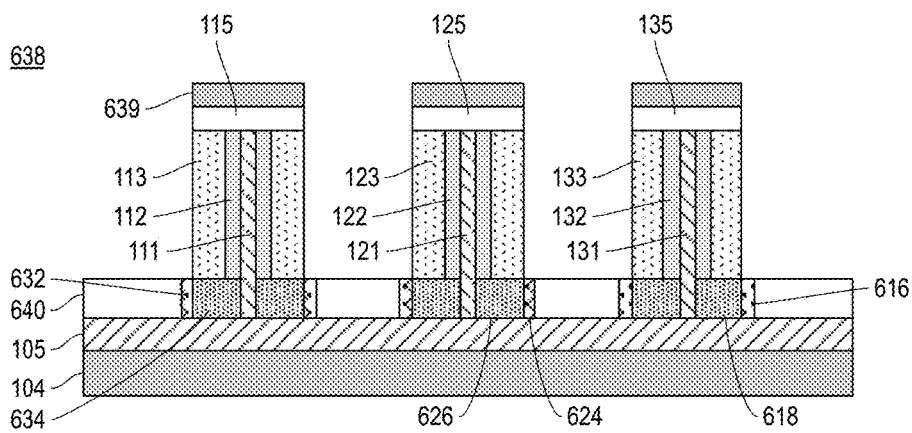
Figure 6U:
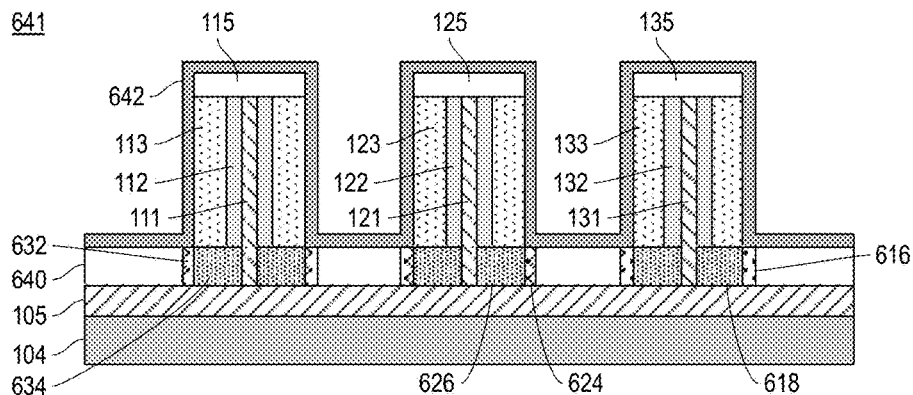
Figure 6V:
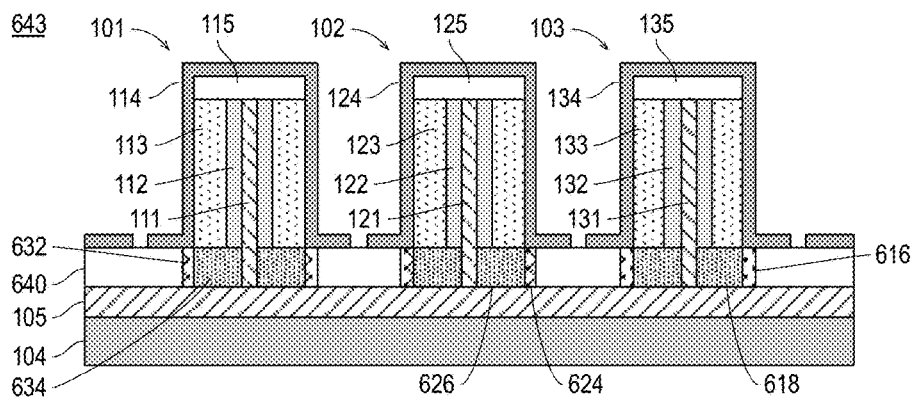
Figure 6W:
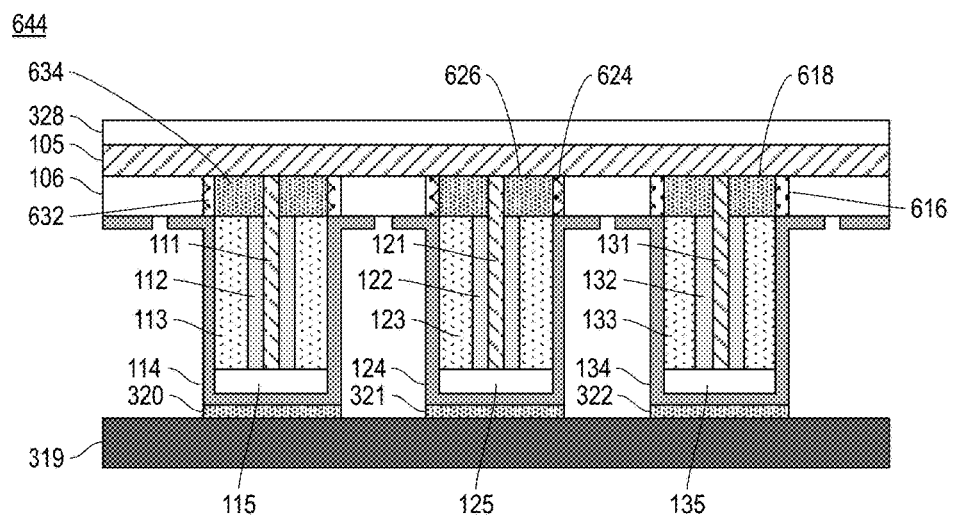

As discussed with respect to FIGS. 6A-6W, an end cap may be disposed over the electron transport layer core and a portion of the patterned layer, another portion of the patterned layer may be removed to provide a sidewall adjacent to the electron transport layer core, and disposing another sidewall adjacent to sidewall material formed from the patterned layer. In such contexts, removing the portion of the patterned layer to expose the portion or portions of the sidewalls of the electron transport layer core may include providing a patterned photoresist layer exposing the end cap and a top of the second sidewall, removing a portion of the second sidewall, and removing a portion of the sidewall formed from the patterned layer. Furthermore, such operations may be repeated to expose a portion or portions of the previously protected electron transport layer core and an emission layer may be formed on that electron transport layer core such that the emission layer has different characteristics with respect to the previous emission layer as discussed further below.

FIGS. 5A, 5B, 5C, 5D, 5E, 5F, 5G, 5H, 5I, 5J, 5K, 5L, 5M, 5N, 5O, 5P, 5Q, 5R, 5S, and 5T are cross-sectional views of example light emitting diode structure s as particular fabrication operations are performed, arranged in accordance with at least some implementations of the present disclosure. FIG. 5A illustrates a cross-sectional view of a light emitting diode structure 501 taken along the same plan as shown in FIG. 1A. As shown in FIG. 5A, light emitting diode structure 501 includes carrier 104, buffer layer 105, and a patterned layer 502 having openings 537, 538, 539. For example, carrier 104 may be any carrier or substrate as discussed herein such as a silicon substrate or wafer, a silicon carbide substrate or wafer, a sapphire substrate or wafer, or the like. Buffer layer 105 may be formed on carrier 104 using any suitable technique or techniques. For example, buffer layer 105 may be deposited and/or grown on carrier 104. Furthermore, buffer layer 105 may include any suitable materials as discussed herein such as a stack of layers including one or more of aluminum nitride, silicon nitride, gallium nitride, or the like.

Patterned layer 502 may include any suitable material or materials such as insulator materials. In an embodiment, patterned layer 502 is silicon dioxide. Patterned layer 502 may be patterned to form openings 537, 538, 539 using any suitable technique or techniques such as lithography and etch techniques. Patterned layer 502 may have any thickness such as a thickness in the range of about 1 to 3 microns. For example, the thickness of patterned layer 502 may be selected to provide a desired height of electron transport layer cores 111, 121, 131. Openings 537, 538, 539 may have any suitable dimensions (e.g., length and widths parallel to carrier 104) such as a length in the range of 1 to 15 microns and a width in the range of about 500 nm to 4 microns. For example, the dimensions of openings 537, 538, 539 may be selected to provide a desired width and length of electron transport layer cores 111, 121, 131 taking into account subsequent sidewall materials within openings 537, 538, 539. In some embodiments, patterned layer 502 may be characterized as a mask layer.

FIG. 5B illustrates a light emitting diode structure 503 similar to light emitting diode structure 501, after the formation of sidewall structures 504. Sidewall structures 504 may be formed using any suitable technique or techniques such as conformal deposition followed by a directional etch or the like. Sidewall structures 504 may include any suitable material or materials and may have dimensions, as discussed with respect to openings 537, 538, 539 to provide the desired size and shape of electron transport layer cores 111, 121, 131. In an embodiment, sidewall structures 504 are silicon nitride sidewall structures. Sidewall structures 504 may also be characterized as spacers or the like.

FIG. 5C illustrates a light emitting diode structure 505 similar to light emitting diode structure 503, after the formation of electron transport layer cores 111, 121, 131. Electron transport layer cores 111, 121, 131 may be formed using any suitable technique or techniques such as metal-organic chemical vapor deposition, metal-organic vapor phase epitaxy, or the like. In some embodiments, electron transport layer cores 111, 121, 131 may be n-doped gallium nitride as discussed herein. In an embodiment, may be transport layer cores 111, 121, 131 may be n-doped gallium nitride grown at a low temperature (e.g., not greater than 400° C.) by supplying nitrogen via ammonia ($NH_3$) or hydrazine ($N_2H_2$). In an embodiment, a chemical mechanical polish operation may be performed after the formation of electron transport layer cores 111, 121, 131. Electron transport layer cores 111, 121, 131 may have any suitable dimensions such as those discussed with respect to FIGS. 1A and 1B. As shown, in an embodiment, tops or distal ends of electron transport layer cores 111, 121, 131 may be recessed with respect to the tops or distal ends of sidewall structures 504.

FIG. 5D illustrates a light emitting diode structure 506 similar to light emitting diode structure 505, after a recess etch of sidewall structures 504 to form recessed sidewall structures 507. The recess etch of sidewall structures 504 to form recessed sidewall structures 507 may be performed using any suitable technique or techniques. For example, the recess etch may include a timed wet etch selective to etching sidewall structures with respect to patterned layer 502. In an embodiment, patterned layer 502 is silicon dioxide and sidewall structures 504 are silicon nitride and a timed selective wet etch may be performed to form recessed sidewall structures 507.

FIG. 5E illustrates a light emitting diode structure 508 similar to light emitting diode structure 506, after the formation of end cap layers 115, 125, 135. End cap layers 115, 125, 135 may be formed using any suitable technique or techniques. In an embodiment, the bulk material of end cap layers 115, 125, 135 is disposed over patterned layer 502, recessed sidewall structures 507, and electron transport layer cores 111, 121, 131 and a chemical mechanical polish operation is performed to form end cap layers 115, 125, 135. End cap layers 115, 125, 135 may include any suitable material or materials. In an embodiment, end cap layers 115, 125, 135 include aluminum nitride.

FIG. 5F illustrates a light emitting diode structure 509 similar to light emitting diode structure 508, after the formation of patterned layer 510 and removal of a portion of patterned layer 502 to provide opening 540. Patterned layer 510 may include any suitable material such as a photoresist material or the like patterned using lithography techniques. Opening 540 may be formed within patterned layer 502 using any suitable technique or techniques such as a time dried etch selective to removing patterned layer 502 and not removing exposed recessed sidewall structures 507 and exposed end cap layer 135. In an embodiment, patterned layer 502 is silicon dioxide, recessed sidewall structures 507 are silicon nitride, end cap layer 135 is aluminum nitride and providing opening 540 includes a timed dry etch selective to removing silicon dioxide over silicon nitride and aluminum nitride.

FIG. 5G illustrates a light emitting diode structure 511 similar to light emitting diode structure 509, after the removal of portions of exposed recessed sidewall structures 507 to form recessed structures 512 and the subsequent removal of patterned layer 510. The portions of exposed recessed sidewall structures 507 may be removed to form recessed structures 512 using any suitable technique or techniques such as a timed wet etch or the like. In an embodiment, patterned layer 502 is silicon dioxide, recessed sidewall structures 507 are silicon nitride, end cap layer 135 is aluminum nitride and removal of portions of exposed recessed sidewall structures 507 includes a timed wet etch selective to removing silicon nitride. Patterned layer 510 may be removed using any suitable technique or techniques such as photoresist strip techniques or the like. As discussed, light emitting diode structure 511 may provide for the exposure of electron transport layer core 131 while electron transport layer cores 111, 121 are covered such that subsequent processing may form a micro light emitting diode to emit a particular band of light (e.g., red, green, or blue).

FIG. 5H illustrates a light emitting diode structure 513 similar to light emitting diode structure 511, after the selective growth of active emission layer 132 and the selective growth of hole transport layer 133. Active emission layer 132 may be formed using any suitable technique or techniques. In an embodiment, active emission layer 132 is formed using selective epitaxy operations such that active emission layer 132 is grown selective to only electron transport layer core 131. Active emission layer 132 may include any suitable material or materials such as one or more layers of indium gallium nitride and one or more layers of gallium nitride. For example, active emission layer 132 may include alternating layers of indium gallium nitride and gallium nitride such that the concentration of indium in the indium gallium nitride layer(s) determines the light band of the resultant micro LED. For example, active emission layer 132 may be selected to fabricate one of a red, green, or blue micro LED. As discussed, an indium concentration of about 41% may provide a red band, an indium concentration of about 37% may provide a green band, and an indium concentration of about 20% may provide a blue band. Hole transport layer 133 may be formed using any suitable technique or techniques such as selective epitaxy techniques such that hole transport layer 133 is grown selective to only active emission layer 132. Hole transport layer 133 may include any suitable material or materials such as p-doped gallium nitride. In an embodiment, hole transport layer 133 may be formed using metal-organic chemical vapor deposition or the like.

FIG. 5I illustrates a light emitting diode structure 514 similar to light emitting diode structure 513, after deposition and polish operations are performed to provide patterned layer 541. For example, such deposition and polish operations may be performed such that patterned layer 541 conceals or recovers electron transport layer core 131, active emission layer 132, and hole transport layer 133 and refills opening 540. Such deposition and polish operations may be performed using any suitable technique or techniques. In an embodiment, patterned layer 502 is silicon dioxide and the deposition includes a plasma enhanced chemical vapor deposition of silicon dioxide.

FIG. 5J illustrates a light emitting diode structure 515 similar to light emitting diode structure 514, after the formation of patterned layer 547, removal of a portion of patterned layer 541 to provide opening 542, and the removal of portions of exposed recessed sidewall structures 507 to form recessed structures 516. Patterned layer 547 may include any suitable material such as a photoresist material or the like patterned using lithography techniques. Opening 542 may be formed within patterned layer 541 using any suitable technique or techniques such as a time dried etch selective to removing patterned layer 541 and not removing exposed recessed sidewall structures 507 and exposed end cap layer 125. In an embodiment, patterned layer 541 is silicon dioxide, recessed sidewall structures 507 are silicon nitride, end cap layer 125 is aluminum nitride and providing opening 542 includes a timed dry etch selective to removing silicon dioxide over silicon nitride and aluminum nitride.

The portions of exposed recessed sidewall structures 507 may be removed to form recessed structures 516 using any suitable technique or techniques such as a timed wet etch or the like. In an embodiment, patterned layer 541 is silicon dioxide, recessed sidewall structures 507 are silicon nitride, end cap layer 125 is aluminum nitride and removal of portions of exposed recessed sidewall structures 507 includes a timed wet etch selective to removing silicon nitride.

FIG. 5K illustrates a light emitting diode structure 517 similar to light emitting diode structure 515, after the removal of patterned layer 547, the selective growth of active emission layer 122, and the selective growth of hole transport layer 123. Patterned layer 547 may be removed using any suitable technique or techniques such as photoresist strip techniques or the like. Active emission layer 122 may be formed using any suitable technique or techniques. In an embodiment, active emission layer 122 is formed using selective epitaxy operations such that active emission layer 122 is grown selective to only electron transport layer core 121. Active emission layer 122 may include any suitable material or materials such as one or more layers of indium gallium nitride and one or more layers of gallium nitride. For example, active emission layer 122 may include alternating layers of indium gallium nitride and gallium nitride such that the concentration of indium in the indium gallium nitride layer(s) determines the light band of the resultant micro LED. For example, active emission layer 122 may be selected to fabricate one of a red, green, or blue LED. As discussed, an indium concentration of about 41% may provide a red band, an indium concentration of about 37% may provide a green band, and an indium concentration of about 20% may provide a blue band. In an embodiment, indium gallium nitride layer(s) of active emission layer 122 have different indium concentrations with respect to indium gallium nitride layer(s) of active emission layer 132 such that the resultant micro LEDs provide different bands of light. Hole transport layer 123 may be formed using any suitable technique or techniques such as selective epitaxy techniques such that hole transport layer 123 is grown selective to only active emission layer 122. Hole transport layer 123 may include any suitable material or materials such as p-doped gallium nitride. In an embodiment, hole transport layer 123 may be formed using metal-organic chemical vapor deposition.

FIG. 5L illustrates a light emitting diode structure 518 similar to light emitting diode structure 517, after deposition and polish operations are performed to provide patterned layer 543. For example, such deposition and polish operations may be performed such that patterned layer 543 conceals or recovers electron transport layer core 121, active emission layer 122, and hole transport layer 123 and refills opening 542. Such deposition and polish operations may be performed using any suitable technique or techniques. In an embodiment, patterned layer 541 is silicon dioxide and the deposition includes a plasma enhanced chemical vapor deposition.

FIG. 5M illustrates a light emitting diode structure 519 similar to light emitting diode structure 518, after the formation of patterned layer 520, removal of a portion of patterned layer 543 to provide opening 544, and the removal of portions of exposed recessed sidewall structures 507 to form recessed structures 521 in analogy with FIG. 5J. For example, patterned layer 520 may include a photoresist material patterned using lithography techniques. Opening 544 may be formed by a time dried etch selective to removing patterned layer 543 and not removing exposed recessed sidewall structures 507 and exposed end cap layer 115. In an embodiment, patterned layer 543 is silicon dioxide, recessed sidewall structures 507 are silicon nitride, end cap layer 125 is aluminum nitride and providing opening 544 includes a timed dry etch selective to removing silicon dioxide over silicon nitride and aluminum nitride. The portions of exposed recessed sidewall structures 507 may be removed to form recessed structure 521 by a timed wet etch or the like. In an embodiment, patterned layer 543 is silicon dioxide, recessed sidewall structures 507 are silicon nitride, end cap layer 115 is aluminum nitride and removal of portions of exposed recessed sidewall structures 507 includes a timed wet etch selective to removing silicon nitride.

FIG. 5N illustrates a light emitting diode structure 522 similar to light emitting diode structure 519, after the removal of patterned layer 520, the selective growth of active emission layer 112, and the selective growth of hole transport layer 113 in analogy with FIG. 5K. For example, patterned layer 520 may be removed by a photoresist strip technique. Active emission layer 112 may be formed using selective epitaxy operations such that active emission layer 112 is grown selective to only electron transport layer core 111. As discussed active emission layer 112 may include one or more layers of indium gallium nitride and one or more layers of gallium nitride. For example, active emission layer 122 may include alternating layers of indium gallium nitride and gallium nitride such that the concentration of indium in the indium gallium nitride layer(s) determines the light band of the resultant micro LED. In an embodiment, indium gallium nitride layer(s) of active emission layer 112 have different indium concentrations than those of both active emission layer 122 and active emission layer 132 such that the resultant micro LEDs provide three different bands of light (e.g., red, green, and blue bands). Hole transport layer 113 may be formed by a selective epitaxy such that hole transport layer 113 is grown selective to only active emission layer 112. Hole transport layer 123 may include, for example, a p-doped gallium nitride.

FIG. 5O illustrates a light emitting diode structure 523 similar to light emitting diode structure 522, after deposition and polish operations are performed to provide patterned layer 545 in analogy with FIG. 5L. For example, patterned layer 545 may conceal or recover electron transport layer core 111, active emission layer 112, and hole transport layer 113 and refills opening 544. In an embodiment, patterned layer 543 is silicon dioxide and the deposition to form patterned layer 545 includes a plasma enhanced chemical vapor deposition.

FIG. 5P illustrates a light emitting diode structure 524 similar to light emitting diode structure 523, after the removal of portions of patterned layer 545 to provide layer 546. For example, layer 546 and recessed structures 512, 516, 521 may provide a dielectric layer in analogy to dielectric layer 106 to isolate reflective claddings 114, 124, 134 (and thereby micro light emitting diodes 101, 102, 103). Portions of patterned layer 545 may be removed to provide layer 546 using any suitable technique or techniques such as timed wet etch techniques or the like. In an embodiment, patterned layer 545 is silicon dioxide and the removal comprises a timed selective wet etch selective to remove portions of patterned layer 545. As shown, light emitting diode structure 524 may be formed without etching any of electron transport layer cores 111, 121, 131, active emission layers 112, 122, 132, or hole transport layers 113, 123, 133. Such fabrication techniques may offer the advantages of reduced damage to the micro light emitting diodes and increased efficiency in operation.

FIG. 5Q illustrates a light emitting diode structure 525 similar to light emitting diode structure 524, after the formation of cladding layer 526. Cladding layer 526 may be formed on end cap layers 115, 125, 135, sidewalls of hole transport layers 113, 123, 133 (e.g., also over electron transport layer cores 111, 121, 131 and active emission layers 112, 122, 132), and exposed portions of layer 546 using any suitable technique or techniques such as electroplating techniques, physical vapor deposition techniques or the like. Cladding layer 526 may include any suitable material or materials such as aluminum, silver, copper, or the like. For example, cladding layer 526 may be a metal layer. As discussed, cladding layer 526 (i.e., reflective claddings 114, 124, 134) reflect light emitted from active emission layers 112, 122, 132 (e.g., multi-quantum wells) of micro light emitting diodes 101, 102, 103 toward buffer layer 105). Furthermore, in some embodiments, the light emitted from micro light emitting diodes 101, 102, 103 is superlambertian.

FIG. 5R illustrates a light emitting diode structure 527 similar to light emitting diode structure 525, after the formation of planarization layer 528. Planarization layer 528 may provide a planar surface for subsequent patterning of cladding layer 526. Planarization layer 528 may include any suitable material or materials and planarization layer 528 may be formed using any suitable technique or techniques. For example, planarization layer 528 may be silicon dioxide formed by plasma enhanced chemical vapor deposition and chemical mechanical polishing.

FIG. 5S illustrates a light emitting diode structure 529 similar to light emitting diode structure 527, after the patterning of planarization layer 528 to provide a patterned layer 530 having openings 531, 532, 533, 534 and patterning of cladding layer 526 to provide reflective claddings 114, 124, 134. Planarization layer 528 may be patterned to provide a patterned layer 530 using any suitable technique or techniques such as lithography and dry etch techniques or the like. Furthermore, cladding layer 526 may be patterned using any suitable technique or techniques such as metal etch techniques or the like.

FIG. 5T illustrates a light emitting diode structure 535 similar to light emitting diode structure 529, after the removal of patterned layer 530, the bonding of the resultant light emitting diode structure to driver circuit 319, the removal of carrier 104, and the formation of common electrode 328 in analogy with FIGS. 3K-3M. Patterned layer 530 may be removed using any suitable technique or techniques such as strip operations or the like. The light emitting diode structure may be bonded to driver circuit 319 using any suitable technique or techniques. For example, driver circuit 319 may include conductive electrodes 320, 321, 322, which may be bonded to reflective claddings 114, 124, 134, respectively. As discussed herein, driver circuit 319 may include any suitable circuitry and/or structures for driving micro light emitting diodes 101, 102, 103 during operation such as transistors, control circuitry, or the like. For example, driver circuit 319 may be provided as a wafer, a thin film transistor device, or the like. Carrier 104 may be removed using any suitable technique or techniques such as polish techniques, wet etch techniques, UV light release techniques, or the like. Electrode 328 may be formed using any suitable technique or techniques. In an embodiment, electrode 328 is indium tin oxide (ITO) deposited using physical vapor deposition and patterned, as needed, using lithography and etch techniques or the like.

As shown, the operations corresponding to FIG. 5T may provide a bonding technique such that all of micro light emitting diodes 101, 102, 103 are flip bonded to driver circuit 319. Processing techniques discussed with respect to FIGS. 5A-5T may provide micro light emitting diodes 101, 102, 103 to emit different bands of light on a monolithic carrier such that no pick and place operations are required for increased processing efficiency and reduced costs. In other examples, driver circuit 319 may be formed by monolithic integration of a thin film transistor (e.g., polysilicon, amorphous silicon, organic TFTs, etc.) or the like.

FIGS. 6A, 6B, 6C, 6D, 6E, 6F, 6G, 6H, 6I, 6J, 6K, 6L, 6M, 6N, 6O, 6P, 6Q, 6R, 6S, 6T, 6U, 6V, and 6W are cross-sectional views of example light emitting diode structure s as particular fabrication operations are performed, arranged in accordance with at least some implementations of the present disclosure. FIG. 6A illustrates a cross-sectional view of a light emitting diode structure 601 taken along the same plan as shown in FIG. 1A. As shown in FIG. 6A, light emitting diode structure 601 includes carrier 104, buffer layer 105, and a patterned layer 602 having openings 646, 647, 648. For example, carrier 104 may be any carrier or substrate as discussed herein such as a silicon substrate or wafer, a silicon carbide substrate or wafer, a sapphire substrate or wafer, or the like. Buffer layer 105 may be formed on carrier 104 using any suitable technique or techniques. For example, buffer layer 105 may be deposited and/or grown on carrier 104. Furthermore, buffer layer 105 may include any suitable materials as discussed herein such as a stack of layers including one or more of aluminum nitride, silicon nitride, gallium nitride, or the like.

Patterned layer 602 may include any suitable material or materials such as insulator materials. In an embodiment, patterned layer 602 is silicon nitride. Patterned layer 602 may be patterned to form openings 646, 647, 648 using any suitable technique or techniques such as lithography and etch techniques. Patterned layer 602 may have any thickness such as a thickness in the range of about 1 to 3 microns. For example, the thickness of patterned layer 602 may be selected to provide a desired height of electron transport layer cores 111, 121, 131. Openings 646, 647, 648 may have any suitable dimensions (e.g., length and widths parallel to carrier 104) such as a length in the range of 1 to 15 microns and a width in the range of about 500 nm to 4 microns. For example, the dimensions of openings 646, 647, 648 may be selected to provide a desired width and length of electron transport layer cores 111, 121, 131. In some embodiments, patterned layer 602 may be characterized as a mask layer.

FIG. 6B illustrates a light emitting diode structure 603 similar to light emitting diode structure 601, after the formation of electron transport layer cores 111, 121, 131. Electron transport layer cores 111, 121, 131 may be formed using any suitable technique or techniques such as metal-organic chemical vapor deposition, metal-organic vapor phase epitaxy, or the like. In some embodiments, electron transport layer cores 111, 121, 131 may be n-doped gallium nitride as discussed herein. In an embodiment, may be transport layer cores 111, 121, 131 may be n-doped gallium nitride grown at a low temperature (e.g., not greater than 400° C.) by supplying nitrogen via ammonia ($NH_3$) or hydrazine ($N_2H_2$). In an embodiment, a chemical mechanical polish operation may be performed after the formation of electron transport layer cores 111, 121, 131.

FIG. 6C illustrates a light emitting diode structure 604 similar to light emitting diode structure 603, after the formation of blocking layer 605. Blocking layer 605 may include any suitable material or materials that may block the subsequent growth of active emission layers 112, 122, 132 having any suitable thickness. For example, blocking layer 605 may be a silicon dioxide layer having a thickness in the range of about 20 to 50 nanometers. Blocking layer 605 may be formed using any suitable technique or techniques such as plasma enhanced vapor deposition followed by a chemical mechanical polish operation or the like.

FIG. 6D illustrates a light emitting diode structure 606 similar to light emitting diode structure 604, after the patterning of blocking layer 605 to provide patterned blocking layer 608 (e.g., an end cap) and patterning of patterned layer 602 to form patterned layer 607. As shown, patterned layer 607 may include portions of sidewall material surrounding each of active emission layers 112, 122, 132. Patterned blocking layer 608 and patterned layer 607 may be patterned using any suitable technique or techniques. For example, a photoresist pattern corresponding to patterned blocking layer 608 may be provided on blocking layer 605 and blocking layer 605 and patterned layer 602 may be etched in turn to provide patterned blocking layer 608 and patterned layer 607. In an embodiment, blocking layer 605 is silicon dioxide, patterned layer 602 is silicon nitride and, subsequent to the photoresist pattern being provided on blocking layer 605, a silicon dioxide dry etch may be performed to provide patterned blocking layer 608 and a subsequent silicon nitride dry etch may be performed to provide patterned layer 607.

FIG. 6E illustrates a light emitting diode structure 609 similar to light emitting diode structure 606, after the formation of sidewall structures 610. Sidewall structures 610 may be formed using any suitable technique or techniques such as conformal deposition followed by a directional etch or the like. Sidewall structures 610 may include any suitable material or materials. In an embodiment, sidewall structures 610 are aluminum oxide sidewall structures. In an embodiment, sidewall structures 610 are aluminum nitride sidewall structures. Sidewall structures 610 may also be characterized as spacers or the like.

FIG. 6F illustrates a light emitting diode structure 611 similar to light emitting diode structure 609, after deposition and polish operations are performed to provide patterned layer 612. Such deposition and polish operations may be performed using any suitable technique or techniques. In an embodiment, patterned layer 612 is silicon dioxide and the deposition includes a plasma enhanced chemical vapor deposition. Such silicon dioxide deposition may then be followed by a chemical mechanical operation to provide a substantially flat surface across patterned layer 612, sidewall structures 610, and patterned blocking layer 608.

FIG. 6G illustrates a light emitting diode structure 613 similar to light emitting diode structure 611, after patterned layer 614 is formed. Patterned layer 614 may be formed using any suitable technique or techniques such as lithography operations. For example, patterned layer 614 may be a photoresist material. As shown, patterned layer 614 exposes sidewall structures 610 and a portion of blocking layer 608 corresponding to electron transport layer core 131 (and, optionally, regions of patterned layer 612 adjacent to sidewall structures 610) while covering or concealing sidewall structures 610 and portions of blocking layer 608 corresponding to electron transport layer cores 111, 121. For example, patterned layer 614 may provide for the subsequent exposure of transport layer core 131 while transport layer cores 111, 121 are concealed such that active emission layer 132 having, as discussed, a particular indium concentration in indium gallium nitride layer(s) of active emission layer 132 may be fabricated to provide a particular band of light when the corresponding micro LED is in operation. During subsequent exposures of transport layer cores 111, 121 and selective growths of active emission layers 112, 122, the indium concentration in indium gallium nitride layer(s) of active emission layers 112, 122 may be varied with respect to that of active emission layer 132 to provide micro LEDs that emit different bands of light (e.g., red, green, and blue bands) during operation.

FIG. 6H illustrates a light emitting diode structure 615 similar to light emitting diode structure 613, after the removal of portions of sidewall structures 610 to form recessed structures 616. The portions of sidewall structures 610 may be removed to form recessed structures 616 using any suitable technique or techniques such as a timed wet etch or the like. In an embodiment, patterned layer 612 is silicon dioxide, sidewall structures 610 are aluminum oxide or aluminum nitride, the exposed portions of patterned layer 607 are silicon nitride, the exposed portion of blocking layer 608 is silicon dioxide and removal of portions of exposed sidewall structures 610 includes a timed wet etch selective to removing aluminum oxide or aluminum nitride with respect to silicon dioxide and silicon nitride.

FIG. 6I illustrates a light emitting diode structure 617 similar to light emitting diode structure 615, after the removal of portions of patterned layer 607 to form recessed structures 618. The portions of patterned layer 607 may be removed to form recessed structures 618 using any suitable technique or techniques such as a timed wet etch or the like. In an embodiment, patterned layer 612 is silicon dioxide, recessed structures 616 are aluminum oxide or aluminum nitride, the exposed portion of blocking layer 608 is silicon dioxide, the exposed portions of patterned layer 607 are silicon nitride, and removal of portions of patterned layer 607 includes a timed wet etch selective to removing silicon nitride selective to aluminum oxide or aluminum nitride and silicon dioxide.

FIG. 6J illustrates a light emitting diode structure 619 similar to light emitting diode structure 617, after the selective growth of active emission layer 132 and the selective growth of hole transport layer 133. Active emission layer 132 may be formed using any suitable technique or techniques. In an embodiment, active emission layer 132 is formed using selective epitaxy operations such that active emission layer 132 is grown selective to only electron transport layer core 131. Active emission layer 132 may include any suitable material or materials such as one or more layers of indium gallium nitride and one or more layers of gallium nitride. For example, active emission layer 132 may include alternating layers of indium gallium nitride and gallium nitride such that the concentration of indium in the indium gallium nitride layer(s) determines the light band of the resultant micro LED. For example, active emission layer 132 may be selected to fabricate one of a red, green, or blue micro LED. Hole transport layer 133 may be formed using any suitable technique or techniques such as selective epitaxy techniques such that hole transport layer 133 is grown selective to only active emission layer 132. Hole transport layer 133 may include any suitable material or materials such as p-doped gallium nitride. In an embodiment, hole transport layer 133 may be formed using metal-organic chemical vapor deposition or the like.

FIG. 6K illustrates a light emitting diode structure 620 similar to light emitting diode structure 619, after deposition and polish operations are performed to provide patterned layer 621. For example, such deposition and polish operations may be performed such that patterned layer 621 conceals or recovers electron transport layer core 131, active emission layer 132, and hole transport layer 133 and refills the opening exploited to grow active emission layer 132 and hole transport layer 133. Such deposition and polish operations may be performed using any suitable technique or techniques. In an embodiment, patterned layer 612 is silicon dioxide and the deposition includes a plasma enhanced chemical vapor deposition of silicon dioxide.

FIG. 6L illustrates a light emitting diode structure 622 similar to light emitting diode structure 620, after patterned layer 623 is formed and after the removal of portions of sidewall structures 610 to form recessed structures 624. Patterned layer 623 may be formed using any suitable technique or techniques such as lithography operations. For example, patterned layer 623 may be a photoresist material. As shown, patterned layer 623 exposes sidewall structures 610 and a portion of blocking layer 608 corresponding to electron transport layer core 121 (and, optionally, regions of patterned layer 621 adjacent to sidewall structures 610) while covering or concealing other structures of light emitting diode structure 622. For example, patterned layer 623 may provide for the subsequent exposure of transport layer core 131 while transport layer core 111, transport layer core 131, active emission layer 132, and hole transport layer 133 are concealed such that active emission layer 122 having, as discussed, a particular indium concentration in indium gallium nitride layer(s) of active emission layer 122 may be fabricated to provide a particular band of light when the corresponding micro LED is in operation (e.g., red, green, or blue bands).

The portions of sidewall structures 610 may be removed to form recessed structures 624 using any suitable technique or techniques such as a timed wet etch or the like. In an embodiment, patterned layer 621 is silicon dioxide, sidewall structures 610 are aluminum oxide or aluminum nitride, the exposed portions of patterned layer 607 are silicon nitride, the exposed portion of blocking layer 608 is silicon dioxide and removal of portions of exposed sidewall structures 610 includes a timed wet etch selective to removing aluminum oxide or aluminum nitride with respect to silicon dioxide and silicon nitride.

FIG. 6M illustrates a light emitting diode structure 625 similar to light emitting diode structure 622, after the removal of portions of patterned layer 607 to form recessed structures 626. The portions of patterned layer 607 may be removed to form recessed structures 626 using any suitable technique or techniques such as a timed wet etch or the like. In an embodiment, patterned layer 621 is silicon dioxide, recessed structures 624 are aluminum oxide or aluminum nitride, the exposed portion of blocking layer 608 is silicon dioxide, the exposed portions of patterned layer 607 are silicon nitride, and removal of portions of patterned layer 607 includes a timed wet etch selective to removing silicon nitride selective to aluminum oxide or aluminum nitride and silicon dioxide.

FIG. 6N illustrates a light emitting diode structure 627 similar to light emitting diode structure 625, after the selective growth of active emission layer 122 and the selective growth of hole transport layer 123. Active emission layer 122 may be formed using any suitable technique or techniques. In an embodiment, active emission layer 122 is formed using selective epitaxy operations such that active emission layer 122 is grown selective to only electron transport layer core 121. Active emission layer 122 may include any suitable material or materials such as one or more layers of indium gallium nitride and one or more layers of gallium nitride. For example, active emission layer 122 may include alternating layers of indium gallium nitride and gallium nitride such that the concentration of indium in the indium gallium nitride layer(s) determines the light band of the resultant micro LED. For example, active emission layer 122 may be selected to fabricate one of a red, green, or blue micro LED. Hole transport layer 123 may be formed using any suitable technique or techniques such as selective epitaxy techniques such that hole transport layer 123 is grown selective to only active emission layer 122. Hole transport layer 123 may include any suitable material or materials such as p-doped gallium nitride. In an embodiment, hole transport layer 123 may be formed using metal-organic chemical vapor deposition or the like.

FIG. 6O illustrates a light emitting diode structure 628 similar to light emitting diode structure 627, after deposition and polish operations are performed to provide patterned layer 629. For example, such deposition and polish operations may be performed such that patterned layer 629 conceals or recovers electron transport layer cores 121, active emission layers 122, and hole transport layers 123, and refills the opening exploited to grow active emission layer 122 and hole transport layer 123. Such deposition and polish operations may be performed using any suitable technique or techniques. In an embodiment, patterned layer 621 is silicon dioxide and the deposition includes a plasma enhanced chemical vapor deposition of silicon dioxide.

FIG. 6P illustrates a light emitting diode structure 630 similar to light emitting diode structure 628, after patterned layer 631 is formed and after the removal of portions of sidewall structures 610 to form recessed structures 632. Patterned layer 631 may be formed using any suitable technique or techniques such as lithography operations. For example, patterned layer 631 may be a photoresist material. As shown, patterned layer 631 exposes sidewall structures 610 and a portion of blocking layer 608 corresponding to electron transport layer core 111 (and, optionally, regions of patterned layer 629 adjacent to sidewall structures 610) while covering or concealing other structures of light emitting diode structure 630. For example, patterned layer 631 may provide for the subsequent exposure of transport layer core 111 while transport layer cores 121, 131, active emission layers 122, 132, and hole transport layers 123, 133 are concealed such that active emission layer 112 having, as discussed, a particular indium concentration in indium gallium nitride layer(s) of active emission layer 122 may be fabricated to provide a particular band of light when the corresponding micro LED is in operation (e.g., red, green, or blue bands).

The portions of sidewall structures 610 may be removed to form recessed structures 632 using any suitable technique or techniques such as a timed wet etch or the like. In an embodiment, patterned layer 629 is silicon dioxide, sidewall structures 610 are aluminum oxide or aluminum nitride, the exposed portions of patterned layer 607 are silicon nitride, the exposed portion of blocking layer 608 is silicon dioxide and removal of portions of exposed sidewall structures 610 includes a timed wet etch selective to removing aluminum oxide or aluminum nitride with respect to silicon dioxide and silicon nitride.

FIG. 6Q illustrates a light emitting diode structure 633 similar to light emitting diode structure 630, after the removal of portions of patterned layer 607 to form recessed structures 634. The portions of patterned layer 607 may be removed to form recessed structures 634 using any suitable technique or techniques such as a timed wet etch or the like. In an embodiment, patterned layer 629 is silicon dioxide, recessed structures 632 are aluminum oxide or aluminum nitride, the exposed portion of blocking layer 608 is silicon dioxide, the exposed portions of patterned layer 607 are silicon nitride, and removal of portions of patterned layer 607 includes a timed wet etch selective to removing silicon nitride selective to aluminum oxide or aluminum nitride and silicon dioxide.

FIG. 6R illustrates a light emitting diode structure 635 similar to light emitting diode structure 633, after the selective growth of active emission layer 112 and the selective growth of hole transport layer 113. Active emission layer 112 may be formed using any suitable technique or techniques. In an embodiment, active emission layer 122 is formed using selective epitaxy operations such that active emission layer 112 is grown selective to only electron transport layer core 111. Active emission layer 112 may include any suitable material or materials such as one or more layers of indium gallium nitride and one or more layers of gallium nitride. For example, active emission layer 122 may include alternating layers of indium gallium nitride and gallium nitride such that the concentration of indium in the indium gallium nitride layer(s) determines the light band of the resultant micro LED. For example, active emission layer 122 may be selected to fabricate one of a red, green, or blue micro LED. Hole transport layer 123 may be formed using any suitable technique or techniques such as selective epitaxy techniques such that hole transport layer 123 is grown selective to only active emission layer 122. Hole transport layer 123 may include any suitable material or materials such as p-doped gallium nitride. In an embodiment, hole transport layer 123 may be formed using metal-organic chemical vapor deposition or the like.

FIG. 6S illustrates a light emitting diode structure 636 similar to light emitting diode structure 635, after deposition and polish operations are performed to provide layer 637. For example, such deposition and polish operations may be performed such that layer 637 conceals or recovers electron transport layer cores 111, active emission layers 112, and hole transport layers 113 and refills the opening exploited to grow active emission layer 112 and hole transport layer 113. Such deposition and polish operations may be performed using any suitable technique or techniques. In an embodiment, layer 629 is silicon dioxide and the deposition includes a plasma enhanced chemical vapor deposition of silicon dioxide. As shown a thickness (t) of layer 637 extends above the distal ends or tops of electron transport layer cores 111, 121, 131, active emission layers 112, 122, 132, and hole transport layers 113, 123, 133. In an embodiment, layer 637 may be characterized as a dielectric layer.

FIG. 6T illustrates a light emitting diode structure 638 similar to light emitting diode structure 636, after patterned layer 639 is formed and after the removal of portions of layer 637 to form end cap layers 115, 125, 135 and patterned layer 640. Patterned layer 639 may be formed using any suitable technique or techniques such as lithography operations. For example, patterned layer 639 may be a photoresist material. Furthermore, portions of layer 637 may be removed to form end cap layers 115, 125, 135 using any suitable technique or techniques. In an embodiment, layer 637 is silicon dioxide and portions of layer 637 are removed by a timed dry etch operation to form end cap layers 115, 125, 135 and patterned layer 640. As shown, light emitting diode structure 638 may be formed without etching any of electron transport layer cores 111, 121, 131, active emission layers 112, 122, 132, or hole transport layers 113, 123, 133. Such fabrication techniques may offer the advantages of reduced damage to the micro light emitting diodes and increased efficiency in operation.

FIG. 6U illustrates a light emitting diode structure 641 similar to light emitting diode structure 638, after the formation of cladding layer 642. Cladding layer 642 may be formed on end cap layers 115, 125, 135, sidewalls of hole transport layers 113, 123, 133 (e.g., also over electron transport layer cores 111, 121, 131 and active emission layers 112, 122, 132), and exposed portions of layer 640, recessed structures 618, 624, 632, and recessed structures 618, 626, 634 using any suitable technique or techniques such as electroplating techniques, physical vapor deposition techniques or the like. Cladding layer 642 may include any suitable material or materials such as aluminum, silver, copper, or the like. For example, cladding layer 642 may be a metal layer. As discussed, cladding layer 642 (i.e., reflective claddings 114, 124, 134) reflect light emitted from active emission layers 112, 122, 132 (e.g., multi-quantum wells) of micro light emitting diodes 101, 102, 103 toward buffer layer 105). Furthermore, in some embodiments, the light emitted from micro light emitting diodes 101, 102, 103 is superlambertian.

FIG. 6V illustrates a light emitting diode structure 643 similar to light emitting diode structure 641, after the formation of planarization layer (not shown), patterning of the planarization layer, patterning of cladding layer 642 to form reflective claddings 114, 124, 134, and removal of the patterned planarization layer. For example, the planarization layer may provide a planar surface for subsequent patterning of cladding layer 642. In an embodiment, the planarization layer is silicon dioxide formed by plasma enhanced chemical vapor deposition and chemical mechanical polishing and the planarization layer is patterned using lithography and etch techniques. Cladding layer 642 may then be patterned through openings in the patterned planarization layer using metal techniques or the like. Such operations may be performed as discussed herein with respect to FIGS. 5Q-5S for example.

FIG. 6W illustrates a light emitting diode structure 644 similar to light emitting diode structure 643, after the bonding of light emitting diode structure 643 to driver circuit 319, the removal of carrier 104, and the formation of common electrode 328 in analogy with FIGS. 3K-3M. Light emitting diode structure 643 may be bonded to driver circuit 319 using any suitable technique or techniques. For example, driver circuit 319 may include conductive electrodes 320, 321, 322, which may be bonded to reflective claddings 114, 124, 134, respectively. As discussed, driver circuit 319 may include any suitable circuitry and/or structures for driving micro light emitting diodes 101, 102, 103 during operation such as transistors, control circuitry, or the like. For example, driver circuit 319 may be provided as a wafer, a thin film transistor device, or the like. Carrier 104 may be removed using any suitable technique or techniques such as polish techniques, wet etch techniques, UV light release techniques, or the like. Electrode 328 may be formed using any suitable technique or techniques. In an embodiment, electrode 328 is indium tin oxide (ITO) deposited using physical vapor deposition and patterned, as needed, using lithography and etch techniques or the like.

As shown, the operations corresponding to FIG. 6W may provide a bonding technique such that all of micro light emitting diodes 101, 102, 103 are flip bonded to driver circuit 319. Processing techniques discussed with respect to FIGS. 6A-6V may provide micro light emitting diodes 101, 102, 103 to emit different bands of light on a monolithic carrier such that no pick and place operations are required for increased processing efficiency and reduced costs. In other examples, driver circuit 319 may be formed by monolithic integration of a thin film transistor (e.g., polysilicon, amorphous silicon, organic TFTs, etc.) or the like.

The devices, systems, and fabrication techniques discussed herein provide micro light emitting diodes that have low power consumption, high pixel density (e.g., greater than 3,000 PPI), high brightness (e.g., 4 million nits), and low manufacturing costs. Furthermore, as discussed, the micro light emitting diodes and/or light emitting diode structure s described herein may be utilized in display devices of any type or form factor for any form factor devices. For example, a system may include a processor, a memory coupled to a processor, a wireless transceiver, and a display device including any micro light emitting diode, light emitting diode structure or combination of micro light emitting diodes or light emitting diode structure s discussed herein. For example, the system may be a mobile computing platform or device such as a watch, a smartphone, a tablet, or a laptop, an augmented reality device, a virtual reality device, a headset, or a typically stationary device such as a television, a monitor, a desktop computer, or the like.

Figure 7:
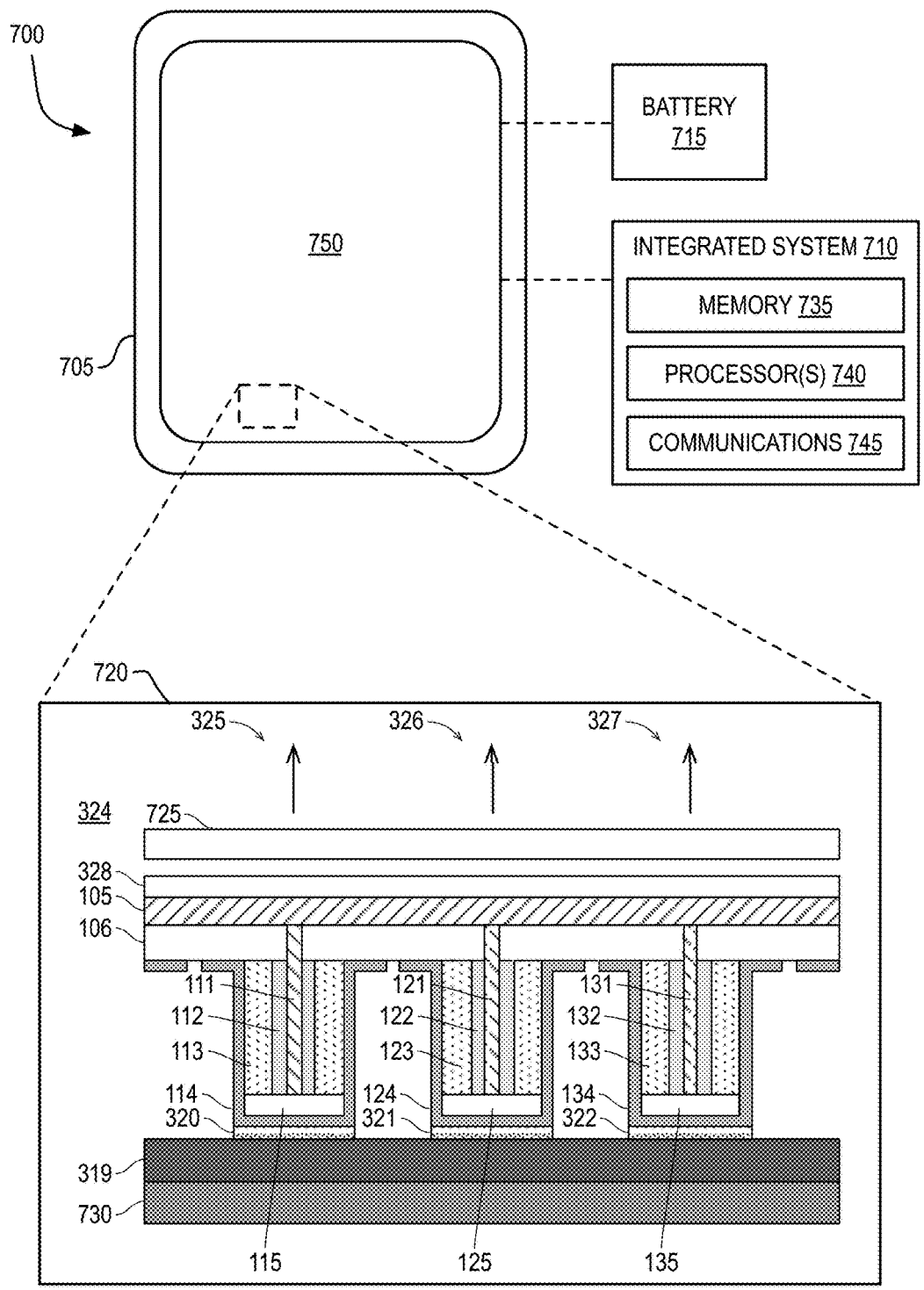
FIG. 7 illustrates a system in which a mobile computing platform employs a light emitting diode structure.

FIG. 7 illustrates a system 700 in which a mobile computing platform 705 employs a light emitting diode structure, arranged in accordance with at least some implementations of the present disclosure. Mobile computing platform 705 may be any portable device configured for each of electronic data display, electronic data processing, wireless electronic data transmission, or the like. For example, although illustrated as a tablet, mobile computing platform 705 may be any of a tablet, a smartphone, a laptop computer, a watch, an augmented reality device, a virtual reality device, a headset etc., and may include a display device 750 employing a light emitting diode structure such as light emitting diode structure 324 as illustrated in expanded view 720.

Also as illustrated in expanded view 720, display device 750 may include a glass front plate 725 and a back plane or plate 730. For example, glass front plate 725 may be disposed adjacent to electrode 328 and may provide protection for components of light emitting diode structure 324 and a monolithic display structure for a viewer of display device 750. Back plane 730 may similarly provide a monolithic structure for implementing and/or housing light emitting diode structure 324 and/or other components of display device 750. In an embodiment, driver circuit 319 is implemented via backplane 730. Furthermore, glass front plate 725 and/or back plane 730 may provide components of and/or be provided within a housing of system 700.

Although illustrated with respect to light emitting diode structure 324, any suitable light emitting diode structure such as light emitting diode structure 535, light emitting diode structure 644 or any suitable micro light emitting diode or diodes such as micro light emitting diodes 101, 102, 103 may be implemented in display device 750. In some embodiments, micro light emitting diodes 101, 102, 103 may be pick and placed on driver circuit 319 as implemented via backplane 730. Furthermore, display device 750 may provide touch capability via a capacitive, inductive, resistive, or optical touchscreen. Also as shown, mobile computing platform 705 includes a chip-level or package-level integrated system 710 and a battery 715. Although illustrated with respect to mobile computing platform 705, the micro light emitting diodes and light emitting diode structure s discussed herein may also be employed via a display of a desktop computer, television, or the like.

Integrated system 710 may be implemented as discrete components (e.g., integrated circuits) or as a system on a chip and may include may include memory circuitry 735

(e.g., random access memory, storage, etc.), processor circuitry 740 (e.g., a microprocessor, a multi-core microprocessor, graphics processor, etc.), and communications circuitry 745 (e.g., a wireless transceiver, a radio frequency integrated circuit, a wideband RF transmitter and/or receiver, etc.). The components of integrated system 710 may be communicatively coupled to one another for the transfer of data within integrated system 710. Functionally, memory circuitry 735 may provide memory and storage for integrated system 710 including image and/or video data for display by display device 750, processor circuitry 740 may provide high level control for mobile computing platform 705 as well as operations corresponding to generating image and/or video data for display by display device 750, and communications circuitry 745 may transmit and/or receive data including image and/or video data for display by display device 750. For example, communications circuitry 745 may be coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 8:
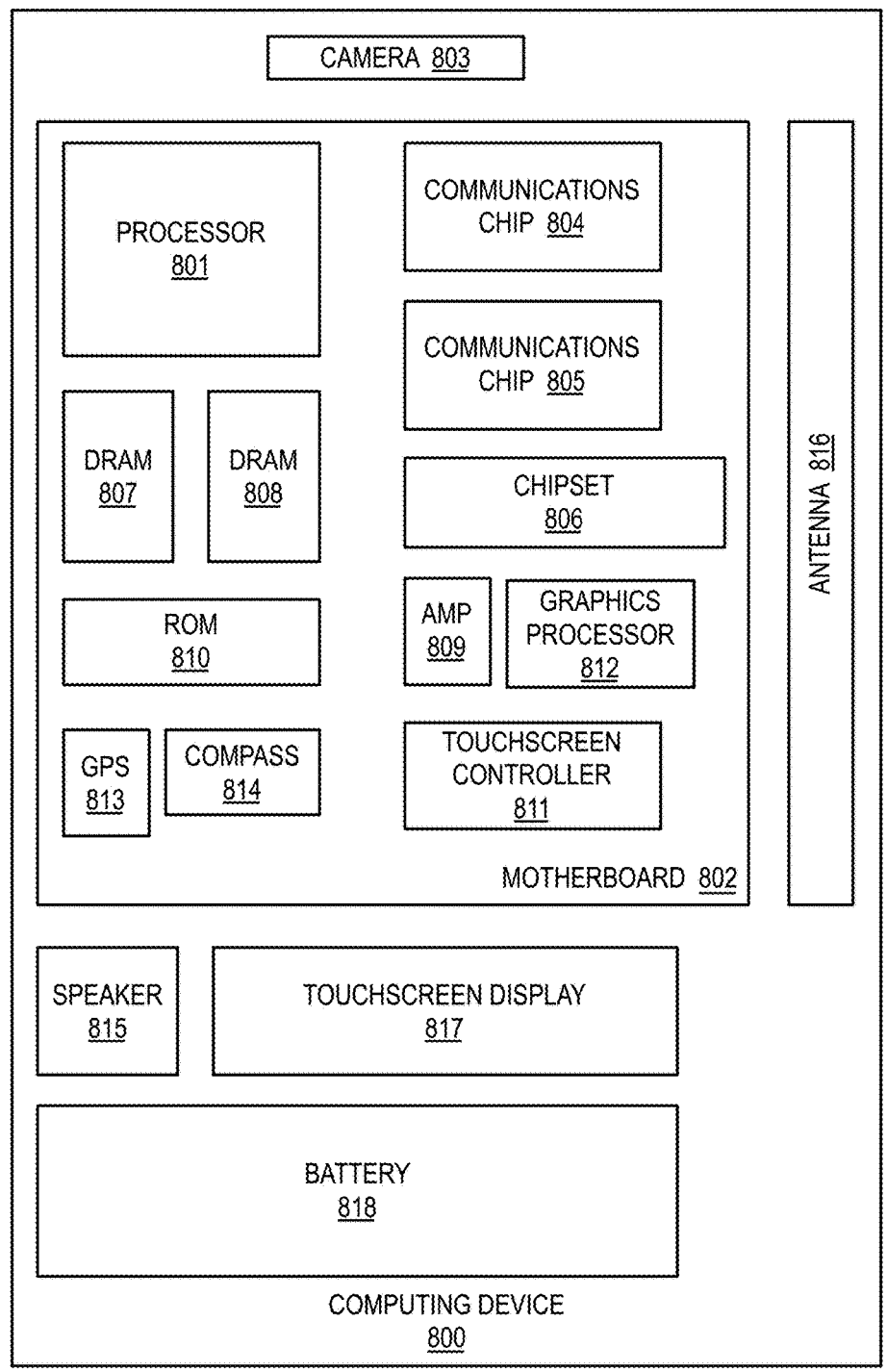
FIG. 8 is a functional block diagram of a computing device, all arranged in accordance with at least some implementations of the present disclosure.

FIG. 8 is a functional block diagram of a computing device 800, arranged in accordance with at least some implementations of the present disclosure. Computing device 800 or portions thereof may be implemented via or mobile computing platform 805, for example, and further includes a motherboard 802 hosting a number of components, such as, but not limited to, a processor 801 (e.g., an applications processor, a microprocessor, etc.) and one or more communications chips 804, 805. Processor 801 may be physically and/or electrically coupled to motherboard 802. In some examples, processor 801 includes an integrated circuit die packaged within the processor 801. In general, the term "processor" may refer to any device or portion of a device that processes electronic data from registers and/or memory to transform that electronic data into other electronic data that may be stored in registers and/or memory.

In various examples, one or more communication chips 804, 805 may also be physically and/or electrically coupled to the motherboard 802. In further implementations, communication chips 804 may be part of processor 801. Depending on its applications, computing device 800 may include other components that may or may not be physically and electrically coupled to motherboard 802. These other components may include, but are not limited to, volatile memory (e.g., DRAM) 807, 808, non-volatile memory (e.g., ROM) 810, a graphics processor 812, flash memory, global positioning system (GPS) device 813, compass 814, a chipset 806, an antenna 816, a power amplifier 809, a touchscreen controller 811, a touchscreen display 817, a speaker 815, a camera 803, and a battery 818, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. For example, touchscreen display 817 may implement any light emitting diode structure (s) or micro light emitting diode(s) discussed herein.

Communication chips 804, 805 may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 804, 805 may implement any of a number of wireless standards or protocols, including but not limited to those described elsewhere herein. As discussed, computing device 800 may include a plurality of communication chips 804, 805. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. For example, one or both of communication chips 804, 805 may provide a wireless transceiver for computing device 800. As discussed, touchscreen display 817 of computing device 800 may include or utilize one or more micro light emitting diodes such as any light emitting diode structure s discussed herein.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following examples pertain to further embodiments.

In one or more first examples, a light emitting diode device comprises an electron transport layer core disposed over a substrate such that the electron transport layer core comprises a first sidewall and a second sidewall opposite the first sidewall and such that the first sidewall and the second sidewall each extend from a proximal end of the electron transport layer core adjacent to the substrate to a distal end of the electron transport layer core extending away from the substrate, an emission layer disposed on both the first and second sidewalls, and a hole transport layer disposed on the emission layer.

In one or more second examples, for any of the first examples, the electron transport layer core further comprises a third sidewall and a fourth sidewall opposite the third sidewall such that the emission layer is disposed on both the third and fourth sidewalls In one or more third examples, for any of the first or second examples, the light emitting diode device further comprises an end cap layer on the distal end of the electron transport layer core.

In one or more fourth examples, for any of the first through third examples, the end cap layer extends over a distal end of the emission layer extending away from the substrate and at least a portion of a distal end of the hole transport layer extending away from the substrate.

In one or more fifth examples, for any of the first through fourth examples, the light emitting diode device further comprises a reflective cladding disposed on the end cap layer and the hole transport layer such that the end cap layer comprises silicon dioxide, the electron transport layer core comprises n-type doped gallium nitride, the emission layer comprises a multi quantum well comprising indium gallium nitride and gallium nitride, the hole transport layer comprises p-type doped gallium nitride, and the substrate comprises a buffer layer.

In one or more sixth examples, for any of the first through fifth examples, the first sidewall has a length along the substrate of not less than one micron, the third sidewall is adjacent to the first sidewall and the third sidewall has a width along the substrate of not less than one micron.

In one or more seventh examples, for any of the first through sixth examples, the first sidewall has a length along the substrate of not less than five microns.

In one or more eighth examples, for any of the first through seventh examples, the light emitting diode device further comprises a metallic reflective cladding disposed over and electrically coupled to the hole transport layer, a driver circuit electrically coupled to the metallic reflective cladding such that the driver circuit is implemented via a back plane of the light emitting diode device, a transparent electrode electrically coupled to the electron transport layer core, and a display glass front plate over the transparent electrode.

In one or more ninth examples, for any of the first through eighth examples, the light emitting diode device further comprises a second electron transport layer core disposed over the substrate such that the electron transport layer core comprises a third sidewall and a fourth sidewall opposite the third sidewall, a second emission layer disposed on both the third and fourth sidewalls, a second hole transport layer disposed on the second emission layer such that the emission layer and the second emission layer comprise different concentrations of indium and such that the substrate comprises a monolithic substrate, and a continuous buffer layer in contact with the electron transport layer core and the second electron transport layer core.

In one or more tenth examples, for any of the first through ninth examples, the light emitting diode device further comprises an insulator layer between a first portion of the continuous buffer layer and a corresponding first portion of the emission layer and a second first portion of the continuous buffer layer and a corresponding second portion of the hole transport layer.

In one or more eleventh examples, for any of the first through tenth examples, a computing platform such as a mobile computing platform comprises a microprocessor, a display device coupled to the microprocessor, the display device including any light emitting diode device of any of the first through tenth examples, and a wireless transceiver communicatively coupled to the microprocessor.

In one or more twelfth examples, a method for fabricating a light emitting diode device comprises disposing an electron transport layer core within a trench of a patterned layer over a substrate such that the electron transport layer core comprises a first sidewall and a second sidewall opposite the first sidewall and such that the first sidewall and the second sidewall each extend from a proximal end of the electron transport layer core adjacent to the substrate to a distal end of the electron transport layer core extending away from the substrate, removing at least a portion of the patterned layer to expose at least a portion of the first sidewall and at least a portion of the second sidewall, disposing an emission layer on both the portion of the first sidewall and the portion of the second sidewall, and disposing a hole transport layer on the emission layer.

In one or more thirteenth examples, for any of the twelfth examples, the method further comprises disposing, prior to removing at least the portion of the patterned layer to expose at least the portion of the first sidewall and at least the portion of the second sidewall, a patterned end cap on the distal end of the electron transport layer core.

In one or more fourteenth examples, for any of the twelfth or thirteenth examples, the method further comprises disposing a reflective metallic cladding over the patterned end cap and the hole transport layer.

In one or more fifteenth examples, for any of the twelfth through fourteenth examples, the method further comprises forming a driver circuit in electrical contact with the reflective metallic cladding and disposing a transparent electrode on a buffer layer of the substrate.

In one or more sixteenth examples, for any of the twelfth through fifteenth examples, removing at least the portion of the patterned layer to expose at least the portion of the first sidewall and at least the portion of the second sidewall comprises a selective exposure wherein the patterned layer protects a second electron transport layer core disposed over the substrate during said disposing the emission layer.

In one or more seventeenth examples, for any of the twelfth through sixteenth examples, the patterned layer comprises a first patterned layer having a first trench and a sidewall material within the first trench to provide the trench and removing at least the portion of the patterned layer to expose at least the portion of the first sidewall and at least the portion of the second sidewall comprises disposing an end cap over the electron transport layer core and the sidewall material, removing a portion of the first patterned layer, and removing a portion of the sidewall material.

In one or more eighteenth examples, for any of the twelfth through seventeenth examples, the method further comprises removing at least a second portion of the patterned layer to expose at least a portion of the second electron transport layer core, disposing a second emission layer different than the emission layer on at least a portion of the second electron transport layer core, disposing a second hole transport layer on the second emission layer, disposing a reflective metallic cladding over the hole transport layer and the second hole transport layer, patterning the reflective metallic cladding to electrically isolate the hole transport layer and the second hole transport layer, and bonding the patterned reflective metallic cladding to a driver circuit.

In one or more nineteenth examples, for any of the twelfth through eighteenth examples, the method further comprises disposing an end cap over the electron transport layer core and at least a second portion of the patterned layer, removing a third portion of the patterned layer to provide a first sidewall adjacent to the electron transport layer core, disposing a second sidewall adjacent to the first sidewall material and at least a portion of the end cap, wherein removing at least the portion of the patterned layer to expose at least the portion of the first sidewall and at least the portion of the second sidewall comprises providing a second patterned layer exposing the end cap and a top of the second sidewall, removing at least a portion of the second sidewall, and removing at least the portion of the patterned layer.

In one or more twentieth examples, for any of the twelfth through nineteenth examples, the method further comprises removing at least a fourth portion of the patterned layer to expose at least a portion of the second electron transport layer core, disposing a second emission layer different than the emission layer on at least a portion of the second electron transport layer core, disposing a second hole transport layer on the second emission layer, disposing a reflective metallic cladding over the hole transport layer and the second hole transport layer, patterning the reflective metallic cladding to electrically isolate the hole transport layer and the second hole transport layer, and bonding the patterned reflective metallic cladding to a driver circuit.

It will be recognized that the embodiments is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. A light emitting diode device comprising:
    an electron transport layer core disposed over a substrate, wherein the electron transport layer core comprises a first sidewall and a second sidewall opposite the first sidewall, and wherein the first sidewall and the second sidewall each extend from a proximal end of the electron transport layer core adjacent to the substrate to a distal end of the electron transport layer core extending away from the substrate;
    an emission layer disposed on both the first and second sidewalls; and
    a hole transport layer disposed on the emission layer.

2. The light emitting diode device of claim 1, wherein the electron transport layer core further comprises a third sidewall and a fourth sidewall opposite the third sidewall, and wherein the emission layer is disposed on both the third and fourth sidewalls.

3. The light emitting diode device of claim 2, further comprising:
    an end cap layer on the distal end of the electron transport layer core.

4. The light emitting diode device of claim 3, wherein the end cap layer extends over a distal end of the emission layer extending away from the substrate and at least a portion of a distal end of the hole transport layer extending away from the substrate.

5. The light emitting diode device of claim 4, further comprising:
    a reflective cladding disposed on the end cap layer and the hole transport layer, wherein the end cap layer comprises silicon dioxide, the electron transport layer core comprises n-type doped gallium nitride, the emission layer comprises a multi quantum well comprising indium gallium nitride and gallium nitride, the hole transport layer comprises p-type doped gallium nitride, and the substrate comprises a buffer layer.

6. The light emitting diode of claim 2, wherein the first sidewall has a length along the substrate of not less than one micron, wherein the third sidewall is adjacent to the first sidewall, and wherein the third sidewall has a width along the substrate of not less than one micron.

7. The light emitting diode device of claim 6, wherein the first sidewall has a length along the substrate of not less than five microns.

8. The light emitting diode device of claim 1, further comprising:
    a metallic reflective cladding disposed over and electrically coupled to the hole transport layer;
    a driver circuit electrically coupled to the metallic reflective cladding, wherein the driver circuit is implemented via a back plane of the light emitting diode device;
    a transparent electrode electrically coupled to the electron transport layer core; and
    a display glass front plate over the transparent electrode.

9. The light emitting diode device of claim 1, further comprising:
    a second electron transport layer core disposed over the substrate, wherein the second electron transport layer core comprises a third sidewall and a fourth sidewall opposite the third sidewall;
    a second emission layer disposed on both the third and fourth sidewalls;
    a second hole transport layer disposed on the second emission layer, wherein the emission layer and the second emission layer comprise different concentrations of indium, and wherein the substrate comprises a monolithic substrate; and
    a continuous buffer layer in contact with the electron transport layer core and the second electron transport layer core.

10. The light emitting diode device of claim 9, further comprising:
    an insulator layer between a first portion of the continuous buffer layer and a corresponding first portion of the emission layer and a second first portion of the continuous buffer layer and a corresponding second portion of the hole transport layer.

11. A mobile computing platform comprising:
    a microprocessor;
    a display device coupled to the microprocessor, the display device comprising:
        an electron transport layer core disposed over a substrate, wherein the electron transport layer core comprises a first sidewall and a second sidewall opposite the first sidewall, and wherein the first sidewall and the second sidewall each extend from a proximal end of the electron transport layer core adjacent to the substrate to a distal end of the electron transport layer core extending away from the substrate;
        an emission layer disposed on both the first and second sidewalls; and
        a hole transport layer disposed on the emission layer; and
    a wireless transceiver communicatively coupled to the microprocessor.

12. The mobile computing platform of claim 11, further comprising:
    an end cap layer on the distal end of the electron transport layer core and extending over a distal end of the emission layer extending away from the substrate and at least a portion of a distal end of the hole transport layer extending away from the substrate, wherein the electron transport layer core further comprises a third sidewall and a fourth sidewall opposite the third sidewall, and wherein the emission layer is disposed on both the third and fourth sidewalls.

13. The mobile computing platform of claim 12, further comprising:
    a reflective cladding disposed on the end cap layer and the hole transport layer, wherein the end cap layer comprises silicon dioxide, the electron transport layer core comprises n-type doped gallium nitride, the emission layer comprises a multi quantum well comprising indium gallium nitride and gallium nitride, and the hole transport layer comprises p-type doped gallium nitride.

14. The mobile computing platform of claim 11, wherein the electron transport layer core further comprises a third sidewall and a fourth sidewall opposite the third sidewall, wherein the emission layer is disposed on both the third and fourth sidewalls, wherein the first sidewall has a width along the substrate of not less than five microns, wherein the third sidewall is adjacent to the first sidewall, and wherein the third sidewall has a width along the substrate of not less than one micron.

15. The mobile computing platform of claim 11, further comprising:
  a metallic reflective cladding disposed over and electrically coupled to the hole transport layer;
  a conductive electrode of a driver circuit electrically coupled to the metallic reflective cladding; and
  a transparent electrode electrically coupled to the electron transport layer core.

16. The mobile computing platform of claim 11, further comprising:
  a second electron transport layer core disposed over the substrate, wherein the second electron transport layer core comprises a third sidewall and a fourth sidewall opposite the third sidewall;
  a second emission layer disposed on both the third and fourth sidewalls;
  a second hole transport layer disposed on the second emission layer, wherein the emission layer and the second emission layer comprise different concentrations of indium, and wherein the substrate comprises a monolithic substrate; and
  a continuous buffer layer in contact with the electron transport layer core and the second electron transport layer core.

17. A method for fabricating a light emitting diode device comprising
  disposing an electron transport layer core within a trench of a patterned layer over a substrate, wherein the electron transport layer core comprises a first sidewall and a second sidewall opposite the first sidewall, and wherein the first sidewall and the second sidewall each extend from a proximal end of the electron transport layer core adjacent to the substrate to a distal end of the electron transport layer core extending away from the substrate;
  removing at least a portion of the patterned layer to expose at least a portion of the first sidewall and at least a portion of the second sidewall;
  disposing an emission layer on both the portion of the first sidewall and the portion of the second sidewall; and
  disposing a hole transport layer on the emission layer.

18. The method of claim 17, further comprising:
  disposing, prior to removing at least the portion of the patterned layer to expose at least the portion of the first sidewall and at least the portion of the second sidewall, a patterned end cap on the distal end of the electron transport layer core.

19. The method of claim 18, further comprising:
  disposing a reflective metallic cladding over the patterned end cap and the hole transport layer.

20. The method of claim 19, further comprising:
  forming a driver circuit in electrical contact with the reflective metallic cladding; and
  disposing a transparent electrode on a buffer layer of the substrate.

21. The method of claim 19, wherein said removing at least the portion of the patterned layer to expose at least the portion of the first sidewall and at least the portion of the second sidewall comprises a selective exposure wherein the patterned layer protects a second electron transport layer core disposed over the substrate during said disposing the emission layer.

22. The method of claim 21, wherein the patterned layer comprises a first patterned layer having a first trench and a sidewall material within the first trench to provide the trench, wherein said removing at least the portion of the patterned layer to expose at least the portion of the first sidewall and at least the portion of the second sidewall comprises:
  disposing an end cap over the electron transport layer core and the sidewall material;
  removing a portion of the first patterned layer; and
  removing a portion of the sidewall material.

23. The method of claim 22, further comprising:
  removing at least a second portion of the patterned layer to expose at least a portion of the second electron transport layer core;
  disposing a second emission layer different than the emission layer on at least a portion of the second electron transport layer core;
  disposing a second hole transport layer on the second emission layer;
  disposing a reflective metallic cladding over the hole transport layer and the second hole transport layer;
  patterning the reflective metallic cladding to electrically isolate the hole transport layer and the second hole transport layer; and
  bonding the patterned reflective metallic cladding to a driver circuit.

24. The method of claim 21, further comprising:
  disposing an end cap over the electron transport layer core and at least a second portion of the patterned layer;
  removing a third portion of the patterned layer to provide a first sidewall material adjacent to the electron transport layer core;
  disposing a second sidewall material adjacent to the first sidewall material and at least a portion of the end cap, wherein said removing at least the portion of the patterned layer to expose at least the portion of the first sidewall and at least the portion of the second sidewall comprises:
    providing a second patterned layer exposing the end cap and a top of the second sidewall material;
    removing at least a portion of the second sidewall material; and
    removing at least the portion of the patterned layer.

25. The method of claim 24, further comprising:
  removing at least a fourth portion of the patterned layer to expose at least a portion of the second electron transport layer core;
  disposing a second emission layer different than the emission layer on at least a portion of the second electron transport layer core;
  disposing a second hole transport layer on the second emission layer;
  disposing a reflective metallic cladding over the hole transport layer and the second hole transport layer;
  patterning the reflective metallic cladding to electrically isolate the hole transport layer and the second hole transport layer; and
  bonding the patterned reflective metallic cladding to a driver circuit.

* * * * *